US012704778B2

(12) United States Patent
Cui et al.

(10) Patent No.: US 12,704,778 B2
(45) Date of Patent: Aug. 11, 2026

(54) RESIST UNDERLAYER COMPOSITIONS AND PATTERN FORMATION METHODS USING SUCH COMPOSITIONS

(71) Applicant: Rohm and Haas Electronic Materials LLC, Marlborough, MA (US)

(72) Inventors: Li Cui, Westborough, MA (US); Shintaro Yamada, Shrewsbury, MA (US); Iou-Sheng Ke, Andover, MA (US); Paul J. LaBeaume, Auburn, MA (US); Suzanne M. Coley, Mansfield, MA (US); James F. Cameron, Brookline, MA (US); Keren Zhang, Shrewsbury, MA (US); Joshua Kaitz, Watertown, MA (US)

(73) Assignee: DUPONT ELECTRONIC MATERIALS INTERNATIONAL, LLC, Marlborough, MA (US)

(*) Notice: Subject to any disclaimer, the term of this patent is extended or adjusted under 35 U.S.C. 154(b) by 773 days.

(21) Appl. No.: 16/428,864

(22) Filed: May 31, 2019

(65) Prior Publication Data

US 2020/0379347 A1 Dec. 3, 2020

(51) Int. Cl.

| | |
|---|---|
| ***G03F 7/11*** | (2006.01) |
| ***C08K 3/04*** | (2006.01) |
| ***C08L 25/06*** | (2006.01) |
| ***C08L 61/06*** | (2006.01) |
| ***G03F 7/00*** | (2006.01) |
| ***G03F 7/09*** | (2006.01) |
| ***G03F 7/16*** | (2006.01) |

(52) U.S. Cl.

CPC ............ *G03F 7/0035* (2013.01); *C08K 3/045* (2017.05); *C08L 25/06* (2013.01); *C08L 61/06* (2013.01); *G03F 7/094* (2013.01); *G03F 7/16* (2013.01); *G03F 7/11* (2013.01)

(58) Field of Classification Search

None

See application file for complete search history.

(56) References Cited

U.S. PATENT DOCUMENTS

| | | | | |
|---|---|---|---|---|
| 4,540,763 | A | 9/1985 | Kirchhoff | |
| 4,812,588 | A | 3/1989 | Schrock | |
| 5,136,069 | A | 8/1992 | Devries et al. | |
| 5,138,081 | A | 8/1992 | Devries et al. | |
| 7,476,486 | B2 | 1/2009 | Hatakeyama et al. | |
| 8,361,694 | B2 | 1/2013 | Sakaguchi et al. | |
| 8,603,732 | B2 | 12/2013 | Ogihara et al. | |
| 2006/0188809 | A1* | 8/2006 | Hatakeyama | G03F 7/0382 430/270.1 |
| 2012/0045900 | A1* | 2/2012 | Watanabe | G03F 7/11 524/852 |
| 2012/0091449 | A1* | 4/2012 | Uetani | C08G 61/12 257/E51.024 |
| 2014/0220783 | A1 | 8/2014 | Koumura et al. | |
| 2015/0368504 | A1* | 12/2015 | Aqad | G03F 7/094 524/592 |
| 2017/0017156 | A1* | 1/2017 | Ogihara | G03F 7/11 |
| 2017/0345669 | A1 | 11/2017 | Robinson et al. | |
| 2020/0212107 | A1* | 7/2020 | Yoshioka | H10K 85/631 |

FOREIGN PATENT DOCUMENTS

| | | | | | |
|---|---|---|---|---|---|
| JP | 2005241963 | A | | 9/2005 | |
| JP | 2006227391 | A | | 8/2006 | |
| JP | 2010195918 | A | | 9/2010 | |
| JP | WO-2011108365 | A1 | * | 6/2013 | G03F 7/11 |
| JP | 2014001349 | A | * | 1/2014 | |
| JP | 2014081572 | A | | 5/2014 | |
| WO | 9425903 | A1 | | 11/1994 | |
| WO | WO-2020189460 | A1 | * | 9/2020 | G03F 7/004 |

OTHER PUBLICATIONS

English Translation of JP 2014-001349 A; Zhang Chunying; Published: Jan. 9, 2014 (Year: 2014).*

English Translation of JPWO 2011/108365 A1; Keisuke Hashimoto; Purblished Jun. 24, 2013 (Year: 2013).*

English Translation of WO 2020/189460 A1; Idei Hiroaki; Published: Sep. 24, 2020 (Year: 2020).*

Wang, et al., "New Route to Incorporation of [60]Fullerene into Polymers via the Benzocyclobutenone Group" Marcomolecules (1998), vol. 31, 5556-5558.

Azadi-Ardakani et al, "3,6-Dimethoxybenzocyclobutenone: A Reagent for Quinone Synthesis", Tetrahedron, vol. 44, No. 18, pp. 5939-5952, 1988.

Beer et al., "High-yield reactive extraction of giant fullerenes from soot" J. Mater. Chem., 1997, 7(8), 1327-1330.

Chung et al., "Synthesis of Furan-, Thiophene- and Pyrrole-fused Sultines and their Application Diels-Alder Reactions" J. Chem. Soc., Chem Commun., (1995), 2537-2539.

Coldham et al., "Intramolecular Dipolar Cycloaddition Reactions of Azomethine Ylides", Chem. Rev. 2005, 105, 2765-2809.

Diederich et al., "Covalent Fullerene Chemistry", Science, 271, 317, (1996), 8 pages.

Dobish et al.; "Synthesis of low-temperature benzocyclobutene cross-linker and utilization" Polym. Chem., 3; Jan. 11, 2012, pp. 857-860.

Fillippone et al., "Exohedral Fullerenes," Encyclopedia of Polymeric Nanomaterials, Springer-Verlag, Berlin, Heidelberg, pp. 1-16, (2014).

(Continued)

*Primary Examiner* — Mark F. Huff

*Assistant Examiner* — Richard David Champion

(74) *Attorney, Agent, or Firm* — CANTOR COLBURN LLP

(57) ABSTRACT

A resist underlayer composition including a polymer having a polymer backbone and a substituted or unsubstituted fullerene group pendant to the polymer backbone, and a solvent in an amount of from 50 to 99.9 weight % based on the total resist underlayer composition.

16 Claims, No Drawings

(56) References Cited

OTHER PUBLICATIONS

Hirsch, et al., "Fullerenes: Chemistry and Reactions," WILEY-VCH Verlag GmbH and Co., Weinheim, Chapter 4, (2005), 84 pages.
Langa et al., "Basic Principles of the Chemical Reactivity of Fullerenes," RSC Publishing, Cambridge, Chapter 2, (2007), 36 pages.
Prato et al., "[3 + 2] and [4 + 2] Cycloadditions of C60" Journal of American Chemical Society, 1993, 115, 1594-1595.
Taylor, "Lecture Notes on Fullerene Chemistry: A Handbook for Chemists," Imperial College Press, London, 15 pages (1999).
Yang et al., "DMAP-Catalyzed [3 + 2] and [4 + 2] Cycloaddition Reactions between [60]Fullerene and Unmodified Morita-Baylis-Hillman Adducts in the Presence of Ac20", J. Org. Chem. 2013, 78, 1163-1170.
Alkmini D. Nega et al., Synthesis of P3HT-b-PS donor-acceptor diblock copolymer carrying pendant fullerenes at positions along the PS block, European Polymer Journal, Aug. 17, 2016, 83, 148-160.

* cited by examiner

RESIST UNDERLAYER COMPOSITIONS AND PATTERN FORMATION METHODS USING SUCH COMPOSITIONS

FIELD

The present disclosure relates to a composition for a resist underlayer film that is useful in a multi-layer resist process to manufacture various semiconductor devices. Specifically, the disclosure relates to a resist underlayer composition including a polymer containing a fullerene group.

INTRODUCTION

Spin-on Carbon (SOC) compositions are used as resist underlayer films in the semiconductor industry as etch masks for lithography in advanced technology nodes for integrated circuit manufacturing. These compositions are often used in tri-layer and quad-layer photoresist integration schemes, where an organic or silicon containing anti-reflective coating and a patternable photoresist film layers are disposed on the bottom layer having a high carbon content SOC material.

An ideal SOC material should possess certain specific characteristics: it should be capable of being cast onto a substrate by a spin-coating process, should be thermally set upon heating with low out-gassing and sublimation, should be soluble in common solvents for good spin bowl compatibility, should have appropriate n/k to work in conjunction with the anti-reflective coating layer to impart low reflectivity necessary for photoresist imaging, and should have high thermal stability to avoid being damaged during subsequent processing steps. In addition to these requirements, the ideal SOC material has to provide a planar film upon spin-coating and thermal curing over a substrate with topography and sufficient dry etch selectivity to silicon-containing layers located above and below the SOC films in order to transfer the photo-patterns into the final substrate in accurate manner.

Rapid development of fullerene chemistry opened a path to new materials research and applications. Using chemical methods, fullerene was incorporated into a variety of small molecules. The resulting derivatives found use in hard-mask formulations and resist compositions. Incorporation of the fullerene into a polymer has been recognized as a simple means of combining the unique properties of the fullerene with macromolecular characteristics such as mechanical strength and good processability. To date, however, the fullerene polymers have not been utilized in SOC applications. Due to poor solubility, many fullerene derivatives cannot be dissolved in common SOC casting solvents, such as PGMEA, cyclohexanone, and anisole. While fullerenes are advantageous for micropatterning because of their excellent etching resistance, the lack of solubility in common underlayer solvents remains a problem making their use in the SOC technology field problematic. There remains a need for new fullerene derivatives with improved solubility to meet specific SOC material requirements.

SUMMARY

An aspect of the present invention provides a resist underlayer composition including a polymer having a polymer backbone and a substituted or unsubstituted fullerene group pendant to the polymer backbone, and a solvent in an amount of from 50 to 99.9 weight % based on the total resist underlayer composition.

Another aspect of the present invention provides a polymer including a polymer backbone, a substituted or unsubstituted fullerene group pendent to the polymer backbone, and a linking group bonded to the polymer backbone and the fullerene group. The polymer may include a reaction product of a substituted or unsubstituted fullerene with a substituted or unsubstituted arylcyclobutene group that is pendant to a precursor polymer backbone.

Yet another aspect of the present invention provides a method of forming a pattern. According to the method, a layer of the resist underlayer composition is applied over a substrate. The applied resist underlayer composition is cured to form a resist underlayer. A photoresist layer is then formed over the resist underlayer.

DETAILED DESCRIPTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the FIGURE, to explain aspects of the present inventive concept. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it may be directly in contact with the other element or intervening elements may be present therebetween. In contrast, when an element is referred to as being "directly on" another element, there are no intervening elements present.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "alkyl group" refers to a group derived from a straight or branched chain saturated aliphatic hydrocarbon having the specified number of carbon atoms and having a valence of at least one.

As used herein, the term "alkoxy group" may refer to "alkyl-O—", wherein the term "alkyl" has the same meaning as described above.

As used herein, the term "alkenyl group" refers to a group derived from a straight or branched chain unsaturated aliphatic hydrocarbon including at least one double bond, having the specified number of carbon atoms, and having a valence of at least one.

As used herein, the term "alkynyl group" refers to a group derived from a straight or branched chain unsaturated aliphatic hydrocarbon including at least one triple bond, having the specified number of carbon atoms, and having a valence of at least one.

As used herein, the term "cycloalkyl group" refers to a monovalent group having one or more saturated rings in which all ring members are carbon.

As used herein, the term "heterocycloalkyl group" refers to a monovalent saturated cyclic group that has atoms of at least two different elements as members of its ring(s), one of which is carbon.

As used herein, the term "aryl", which is used alone or in combination, refers to an aromatic hydrocarbon containing at least one ring and having the specified number of carbon atoms. The term "aryl" may be construed as including a group with an aromatic ring fused to at least one cycloalkyl ring.

As used herein, the term "heteroaryl", which is used alone or in combination, refers to an aromatic hydrocarbon containing at least one ring that has atoms of at least two different elements as members of its ring(s), one of which is carbon, and having the specified number of carbon atoms.

As used herein, the term "alkylene group" may refer to a straight or branched saturated aliphatic hydrocarbon group having a valence of at least two, optionally substituted with one or more substituents where indicated, provided that the valence of the alkylene group is not exceeded.

As used herein, the term "alkenylene group" may refer to a straight or branched aliphatic hydrocarbon group having a valence of at least two, having at least one carbon-carbon double bond, optionally substituted with one or more substituents where indicated, provided that the valence of the alkylene group is not exceeded.

As used herein, the term "alkynylene group" may refer to a straight or branched aliphatic hydrocarbon group having a valence of at least two, having at least one carbon-carbon triple bond, optionally substituted with one or more substituents where indicated, provided that the valence of the alkylene group is not exceeded.

As used herein, the term "substituted" means including at least one substituent such as a halogen (F, Cl, Br, I), hydroxyl, amino, thiol, ketone, anhydride, sulfone, sulfoxide, sulfonamide, carboxyl, carboxylate, ester (including acrylates, methacrylates, and lactones), amide, nitrile, sulfide, disulfide, nitro, $C_{1-20}$ alkyl, $C_{3-20}$ cycloalkyl (including adamantyl), $C_{1-20}$ alkenyl (including norbornenyl), $C_{1-20}$ alkoxy, $C_{2-20}$ alkenoxy (including vinyl ether), $C_{6-30}$ aryl, $C_{6-30}$ aryloxy, $C_{7-30}$ alkylaryl, or $C_{7-30}$ alkylaryloxy.

When a group containing a specified number of carbon atoms is substituted with any of the groups listed in the preceding paragraphs, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{20}$ alkyl" refers to a $C_1$-$C_{20}$ alkyl group substituted with $C_6$-$C_{30}$ aryl group, the total number of carbon atoms in the resulting aryl substituted alkyl group is $C_7$-$C_{50}$.

As used herein, the term "hetero" refers to inclusion of one to three heteroatoms selected from the group consisting of N, O, S, Si, and P.

As used herein, the term "mixture" refers to any combination of the ingredients constituting the blend or mixture without regard to a physical form.

The present invention applies to both random and block copolymers, and if not stated otherwise, the polymer is random.

An aspect of the present invention provides a resist underlayer composition including a polymer having a polymer backbone and a substituted or unsubstituted fullerene group pendant to the polymer backbone. Schematically, the polymer may be depicted as follows:

Scheme 1

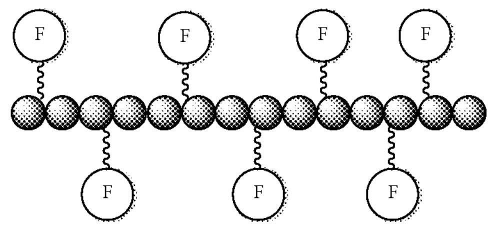

In Scheme 1,

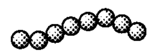

represents the polymer backbone,

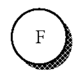

represents the substituted or unsubstituted fullerene group, and ~ represents a bond or a linking group.

The polymer backbone may be either synthetic or naturally occurring, and is preferably a synthetic polymer selected from oligomers, homopolymers, and copolymers resulting from radical or non-radical addition or condensation polymerization of monomers. The polymer backbone may be formed by a radical addition of an unsaturated monomer such as a monomer containing a substituted or unsubstituted vinyl group. In an embodiment, the polymer backbone may include carbon atoms only. In another embodiment, the polymer backbone may also include heteroatoms selected from N, P, As, O, S, Se, Si, Ge, but is not limited thereto.

The polymer may, for example, be a polyalkylene, a polyalkylene oxide, a polyarylene, a Novolac polymer, a vinyl aromatic polymer, a (meth)acrylate polymer, a polyester, a norbornene polymer, a polyimide, a combination thereof, or a copolymer thereof, but is not limited thereto. Of these, vinyl aromatic and Novolac polymers are preferred.

The polymer further includes a fullerene group pendant to the polymer backbone. As used herein, the term "fullerene" refers to a carbon cluster in a closed shell shape formed of carbon atoms arranged in a spherical shape or elongated spherical (spheroid) shape. The number of carbons in the fullerene may be 60 to 120. Fullerenes may have different allotropes, including, without limitation, $C_2$, $C_{28}$, $C_{36}$, $C_{50}$, $C_{60}$, $C_{70}$, $C_{76}$, $C_{78}$, $C_{80}$, $C_{82}$, $C_{84}$, $C_{86}$, $C_{90}$, $C_{92}$, $C_{94}$, $C_{96}$, and $C_{98}$, indicating the cage structure without substituents. In some instances, different allotropes may have the same number of carbon atoms. For closed structures Euler's polyhedron formula V−E+F=2 applies, wherein V, E, F are respectively the numbers of vertices, edges, and faces. Examples of fullerenes may include a closed polyhedron cage-type molecule containing carbon atoms in even numbers of 60 or more and having 12 pentagon faces (5-membered rings) and m/2-10 hexagon faces (6-membered rings), wherein m represents the number of carbon atoms. The fullerene group may be unsubstituted or substituted with 1-20 substituent groups. For example, the fullerene group may be substituted with 1-15 substituent groups, 1-10 substituent groups, or 1-5 substituent groups.

As shown in the above diagram, the fullerene group may have one point of attachment to the polymer backbone. In other embodiment, the fullerene group may have two or more attachment points. In those embodiments, the fullerene group may be attached to the same polymer backbone (Scheme 2), different polymer backbones (Scheme 3), or both.

Scheme 2

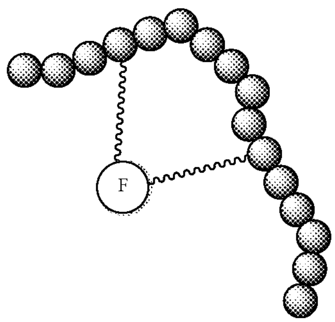

Scheme 3

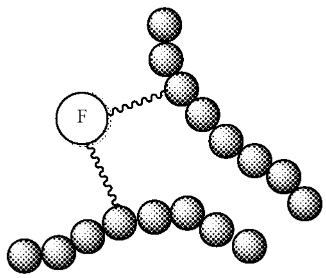

The fullerene group may be attached to the polymer backbone through a bond or a linking group. In an embodiment, the linking group may be a hydrocarbon group which may optionally include heteroatoms as chain members or substituents. In another embodiment, the linking group may include at least one cyclic group, which could be aromatic or non-aromatic. For example, the linking group may include a substituted or unsubstituted $C_{3-20}$ alicyclic group, a substituted or unsubstituted $C_{2-20}$ heteroalicyclic group, a substituted or unsubstituted $C_{6-20}$ aromatic group, a substituted or unsubstituted $C_{3-20}$ heteroaromatic group, or a combination thereof.

The linking group may also include a first auxiliary group connecting at least one cyclic group to the polymer backbone. The first auxiliary group may be a $C_{1-10}$ alkylene group, a $C_{2-10}$ alkenylene group, a $C_{2-10}$ alkynylene group, an ether group, a carbonyl group, an ester group, a carbonate group, an amine group, an amide group, a urea group, a sulfate group, a sulfone group, a sulfoxide group, an N-oxide group, a sulfonate group, a sulfonamide group, or any combination of at least two of the foregoing.

The linking group may include two or more cyclic groups which may be fused to each other or which may be connected to each other via a single bond or a second auxiliary linking group. The second auxiliary group may be selected from the groups described above in connection with the first auxiliary group.

In an embodiment, the linking group may include a $C_{1-20}$ aromatic group or a $C_{3-20}$ heteroaromatic group fused to a $C_{3-20}$ alicyclic group or a $C_{2-20}$ heteroalicyclic group to form a bicyclic ring system. The bicyclic ring system may be attached to the polymer backbone and the fullerene group by using any atom having the ability for bonding (i.e., having free valency). The bicyclic ring system may include a $C_{3-20}$ alicyclic group fused to a $C_{6-20}$ aromatic group. In an example, the bicyclic ring system may be a substituted or unsubstituted 1,2,3,4-tetrahydronaphthalene ring system.

The two or more cyclic groups present in the linking group may be fused to the fullerene. In an embodiment, the linking group may include the $C_{3-20}$ alicyclic group or the $C_{2-20}$ heteroalicyclic group fused to the fullerene. For example, the linking group may include a cyclohexane group fused to the fullerene group.

In another embodiment, the linking group may include two or more instances of the ring fusion. For example, the linking group may include a substituted or unsubstituted $C_{3-20}$ alicyclic group or the $C_{2-20}$ heteroalicyclic group that forms a fused ring with the fullerene group, and the $C_{6-20}$ aromatic group or the $C_{3-20}$ heteroaromatic group that is fused to the $C_{3-20}$ alicyclic group or the $C_{2-20}$ heteroalicyclic group. For example, the linking group may include a cyclohexane group that is fused with the fullerene and the benzene group that is fused with the cyclohexane group. The linking group may include a substituted or unsubstituted 1,2,3,4-tetrahydronaphthalene group that is fused with the fullerene through the cyclohexane group.

In still another embodiment, the linking group may include a substituted or unsubstituted $C_{3-20}$ alicyclic group or a substituted or unsubstituted $C_{2-20}$ heteroalicyclic group, which is attached to the polymer through a single bond or a first auxiliary group selected from a $C_{1-10}$ alkyl group, an ether group, a carbonyl group, an ester group, a carbonate group, an amine group, an amide group, a urea group, a sulfate group, a sulfone group, a sulfoxide group, an N-oxide group, a sulfonate group, a sulfonamide group, and a combination of at least two of the foregoing.

In an embodiment, the linking group may be represented by Formula 1:

Formula 1

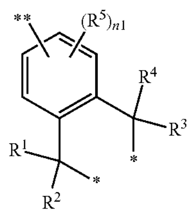

In Formula 1, $R^1$ to $R^5$ may each independently be hydrogen, deuterium, a substituted or unsubstituted $C_{1-20}$ linear or branched alkyl group, a substituted or unsubstituted $C_{6-20}$ aryl group, a substituted or unsubstituted $C_{7-20}$ arylalkyl group, a substituted or unsubstituted $C_{3-20}$ heteroaryl group, a substituted or unsubstituted $C_{3-30}$ heteroarylalkyl group, a substituted or unsubstituted $C_{3-30}$ cycloalkyl group, a substituted or unsubstituted $C_{3-30}$ heterocycloalkyl group, a $C_{1-20}$ alkoxy group, a hydroxy group, —$NH_2$; —NRR' (wherein R and R' are independently hydrogen or a $C_{1-20}$ linear or branched alkyl group, an isocyanate group, a halogen, —ROR' (wherein R is a substituted or unsubstituted $C_{1-20}$ alkylene group and R' is hydrogen or a $C_{1-20}$ linear or branched alkyl group, —RC(═O)X (wherein R is a substituted or unsubstituted alkylene group and X is a halogen), —C(═O)OR' (wherein R' is hydrogen or a $C_{1-20}$ linear or branched alkyl group), —OC(═O)R' (wherein R' is hydrogen or a $C_{1-20}$ linear or branched alkyl group), —CN, —OC(═O)NRR' (wherein R and R' are independently hydrogen or a $C_{1-20}$ linear or branched alkyl group), —S(═O)R' (wherein R' is hydrogen or a $C_{1-20}$ linear or branched alkyl group), and —$S(=O)_2R'$ (wherein R' is hydrogen or a $C_{1-20}$ linear or branched alkyl group), provided that each R is not hydrogen. Any two adjacent groups selected from $R^1$ to $R^5$ may be optionally connected to form a ring.

In Formula 1, n1 may be 0, 1, 2, or 3, * indicates a point of attachment directly or indirectly to the fullerene, and ** indicates a point of attachment to the polymer backbone.

In another embodiment, the linking group may be represented by Formula 2:

Formula 2

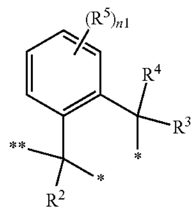

In Formula 2, $R^2$ to R and n1 are the same as those described with regard to Formula 1, * indicates a point of attachment directly or indirectly to the fullerene, and ** indicates a point of attachment to the polymer backbone.

The linking group may be attached to the polymer backbone through a single bond or a group selected from a $C_{1-10}$ alkylene group, an ether group, a carbonyl group, an ester group, a carbonate group, an amine group, an amide group, a urea group, a sulfate group, a sulfone group, a sulfoxide group, an N-oxide group, a sulfonate group, a sulfonamide group, and a combination of at least two of the foregoing. For example, the polymer backbone may be composed of the ethylene or propylene structural units and the linking group may be attached to the ethylene or propylene structural units of the polymer backbone through a single bond. In another example, the polymer backbone may be composed of (meth) acrylate structural units and the linking group may be attached to the polymer backbone through an ester group of the (meth)acrylate structural units.

In an embodiment, the linking group may include a substituted or unsubstituted $C_{6-20}$ aromatic group or a substituted or unsubstituted $C_{3-20}$ heteroaromatic group. In another embodiment, the linking group may include a substituted or unsubstituted $C_{3-20}$ alicyclic group or a substituted or unsubstituted $C_{2-20}$ heteroalicyclic group. The substituted or unsubstituted $C_{6-20}$ aromatic group, the substituted or unsubstituted $C_{3-20}$ heteroaromatic group, the substituted or unsubstituted $C_{3-20}$ alicyclic group, and the substituted or unsubstituted $C_{2-20}$ heteroalicyclic group in these embodiments may be attached to the polymer through a single bond or a group constituting a part of the polymer backbone, which may be selected from a $C_{1-10}$ alkylene group, an ether group, a carbonyl group, an ester group, a carbonate group, an amine group, an amide group, a urea group, a sulfate group, a sulfone group, a sulfoxide group, an N-oxide group, a sulfonate group, a sulfonamide group, or a combination of at least two of the foregoing.

In still another embodiment, the linking group may be represented by Formula 3:

Formula 3

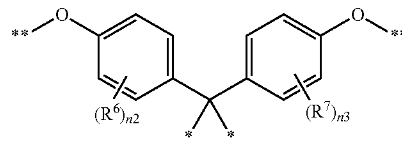

In Formula 3, $R^6$ and $R^7$ may each independently be deuterium, a substituted or unsubstituted $C_{1-20}$ linear or branched alkyl group, a substituted or unsubstituted $C_{6-20}$ aryl group, a substituted or unsubstituted $C_{7-20}$ arylalkyl group, a substituted or unsubstituted $C_{3-20}$ heteroaryl group, a substituted or unsubstituted $C_{3-30}$ heteroarylalkyl group, a substituted or unsubstituted $C_{3-30}$ cycloalkyl group, a substituted or unsubstituted $C_{3-30}$ heterocycloalkyl group, a $C_{1-20}$ alkoxy group, a hydroxy group, —$NH_2$; —NRR' (wherein R and R' are independently hydrogen or a $C_{1-20}$ linear or branched alkyl group, an isocyanate group, a halogen, —ROR' (wherein R is a substituted or unsubstituted $C_{1-20}$ alkylene group and R' is hydrogen or a $C_{1-20}$ linear or branched alkyl group, —RC(═O)X (wherein R is a substituted or unsubstituted alkylene group and X is a halogen), —C(═O)OR' (wherein R' is hydrogen or a $C_{1-20}$ linear or branched alkyl group), —CN, —OC(═O)R' (wherein R' is hydrogen or a $C_{1-20}$ linear or branched alkyl group), —OC(═O)NRR' (wherein R and R' are independently hydrogen or a $C_{1-20}$ linear or branched alkyl group), —S(═O)R' (wherein R' is hydrogen or a $C_{1-20}$ linear or branched alkyl group), and —$S(=O)_2R'$ (wherein R' is hydrogen or a $C_{1-20}$ linear or branched alkyl group). Any two adjacent groups selected from $R^6$ and any two adjacent groups selected from $R^7$ may be optionally connected to form a ring.

In Formula 3, n2 and n3 may each independently be 0, 1, 2, 3, or 4, * indicates a point of direct or indirect attachment to the fullerene and ** indicates a point of attachment to the polymer.

The linking group having Formula 3 has two points of attachment to the fullerene. The linking group having Formula 3 may be fused to the fullerene through a 3- to 10-membered carbocyclic or heterocyclic ring, for example, a 3- to 8-membered carbocyclic or heterocyclic ring, or a 3- to 6-membered carbocyclic or heterocyclic ring. For example, the linking group having Formula 3 may be fused to the fullerene through a 3-membered carbocyclic or heterocyclic ring.

The polymer may include one or more polymerized units that may include various functionalities. An exemplary polymer having such additional functionalities is depicted in Scheme 4:

Scheme 4

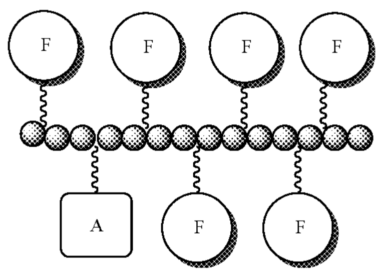

In Scheme 4,

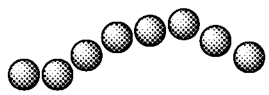

represents a polymer backbone,

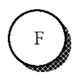

represents a fullerene group, ~~~ represents a bond or a linking group, and

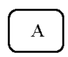

represents an optional functionality.

The optional functionality can include, for example: crosslinkable groups such as arylcyclobutenes (such as benzocyclobutene (BCB)), epoxy and hydroxy groups; solubility-enhancing groups such as hydroxy, phenolic, and acid groups; etch-resistant groups such as pyridyl, phenyl, naphthyl, acenaphthyl, fluorenyl, carbazolyl, anthracenyl, phenanthryl, pyrenyl, coronenyl, tetracenyl, pentacenyl, tetraphenyl, benzotetracenyl, triphenylenyl, perylenyl, benzyl, phenethyl, tolyl, xylyl, styrenyl, vinylnaphthyl, vinylanthracenyl, dibenzothiophenyl, thioxanthonyl, indolyl, acridinyl, biphenyl, phenoxy-phenyl, and binaphthyl groups; optical property (e.g., n and k values)—enhancement groups such as those described with respect to the etch-resistant groups; surface energy adjustment groups such as alkyl and fluoroalkyl groups; and glass transition temperature adjustment groups such as alkyl and fluoroalkyl groups. Suitable polymerized units include, for example, one or more units chosen from the following general Formulae 4 and 5:

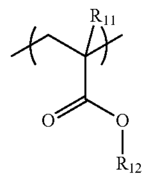

Formula 4

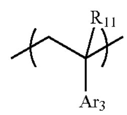

Formula 5

In Formulae 4 and 5, $R_{11}$ is independently selected from hydrogen, fluorine, $C_{1-3}$ alkyl, and $C_{1-3}$ fluoroalkyl, $R_{12}$ is selected from optionally substituted $C_{1-10}$ alkyl; and $Ar_3$ is an aryl group. Preferably, $Ar_3$ includes 1, 2, or 3 aromatic carbocyclic and/or heteroaromatic rings. It is preferred that the aryl group comprises a single aromatic ring, and more preferably a phenyl ring. The aryl group is optionally substituted with, for example, $(C_1$-$C_6)$alkyl, $(C_1$-$C_6)$alkoxy or halo. It is preferred that the aryl group is unsubstituted.

The polymer may include structural units including crosslinking functionalities that are present in various resins such as an epoxy phenolic Novolak resin, an epoxy cresylic Novolak resin, an epoxy bisphenol A resin, or an epoxy bisphenol Novolak resin, an alkylolmethyl melamine resin, an alkylolmethyl glycoluril resin, an alkylolmethyl guanamine resin, an alkylomethyl benzoguanamine resin, a glycosyl urea resin, or an isocyanate (alkyd) resin.

Exemplary suitable structures of the additional units for solubility improvement may include the following:

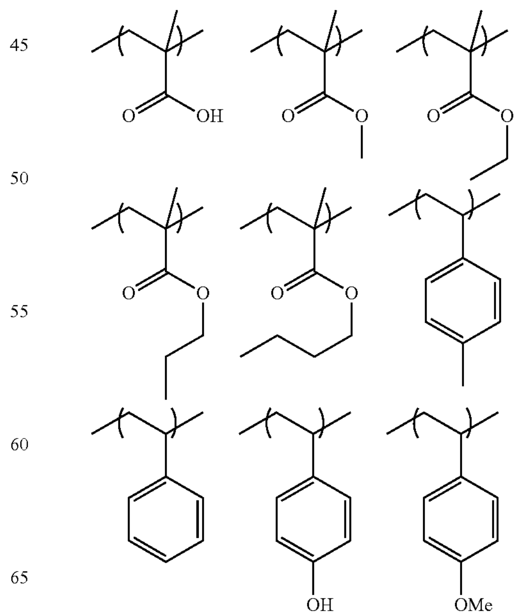

-continued

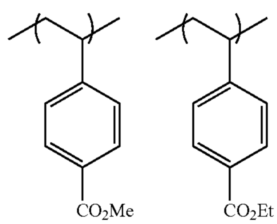

Exemplary suitable structures of the additional units for tuning on optical properties and etch resistance may include the following:

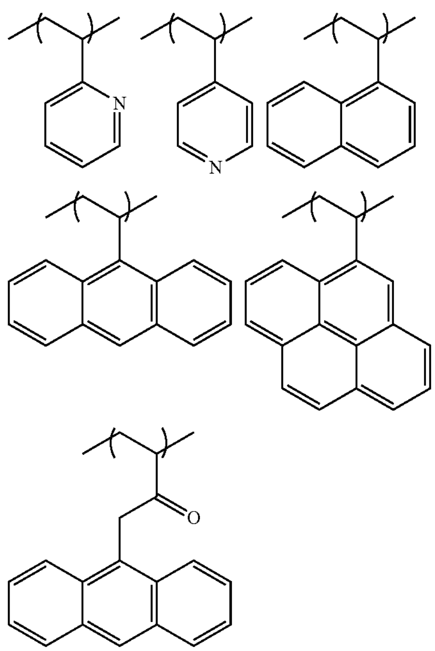

Exemplary suitable structures of the additional units for tuning surface energy may include the following:

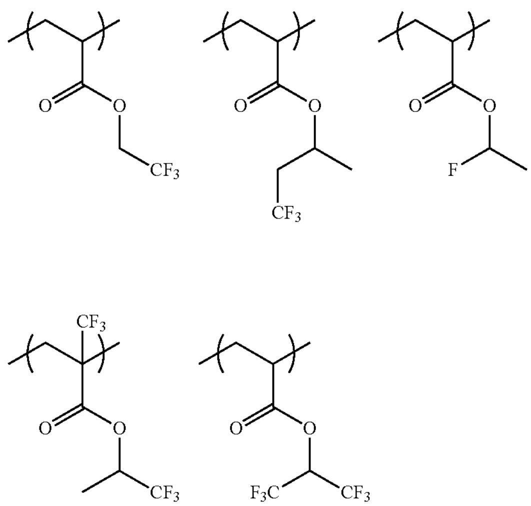

-continued

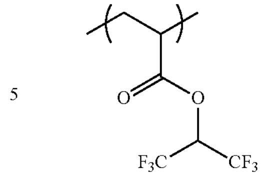

Exemplary suitable structures of the additional units useful for self-crosslinking may include the following:

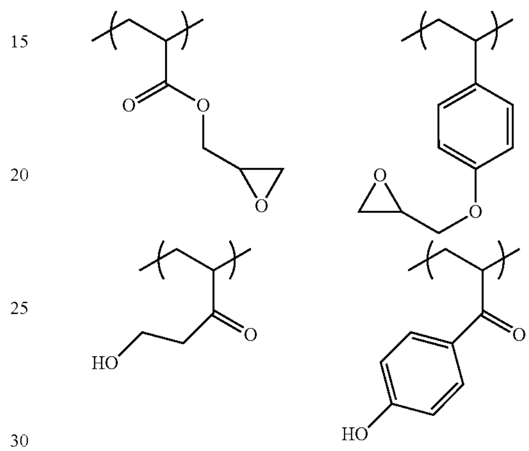

The one or more units containing additional functionality if present in the polymer may be used in an amount of up to 99 mol %, preferably from 75 to 98 mol %, and more preferably from 80 to 95 mol % based on the polymer.

The polymer preferably has a weight average molecular weight $M_w$ of less than 100,000, preferably, a $M_w$ of 1,000 to 50,000. The polymer typically has a polydispersity index ($PDI=M_w/M_n$) of less than 2.0, and more preferably less than 1.8. Molecular weight, both $M_w$ and $M_n$, may be determined by, for example, gel permeation chromatography using a universal calibration method, and calibrated to polystyrene standards.

A pendant fullerene group may be a part of the monomer to prepare a polymer according to the embodiments of the present invention. In such a monomer, the pendant fullerene group may be attached to the polymer backbone via a bond or a linking group. The polymer of the present invention may thus be obtained by a polymerization of the monomer containing a pendant fullerene group. In the resulting polymer, the fullerene group may be directly attached to the polymer backbone via a bond or a linking group. In other embodiments, the polymer of the present invention may be obtained by a two-step process, including (1) polymerization of a monomer including a linking group precursor to form a prepolymer having a pendant group, and (2) reaction of the pendant group of the prepolymer with fullerene. The unsaturated monomer may be an arylcyclobutene monomer. Arylcyclobutene monomers useful in the inventive concept may be prepared by any suitable means, such as those described in M. Azadi-Ardakani et al, "3,6-Dimethoxybenzocyclobutenone: A Reagent for Quinone Synthesis", *Tetrahedron*, Vol. 44, No. 18, pp. 5939-5952, 1988; J. Dobish et al, *Polym. Chem.*, 2012, 3, 857-860 (2012); U.S. Pat. Nos. 4,540,763; 4,812,588; 5,136,069; 5,138,081; and International Pat. App. No. WO 94/25903. Arylcyclobutenes useful in making the monomers are commercially available, for example, under the Cyclotene™ brand, available from The Dow Chemical Company, or can readily be made by persons skilled in the art.

Suitable arylcyclobutene monomers include, for example, unsaturated monomers which form the linking group represented by Formula 1:

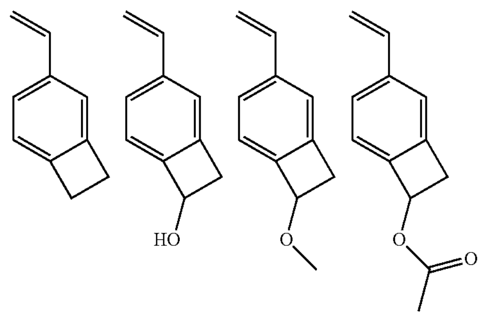

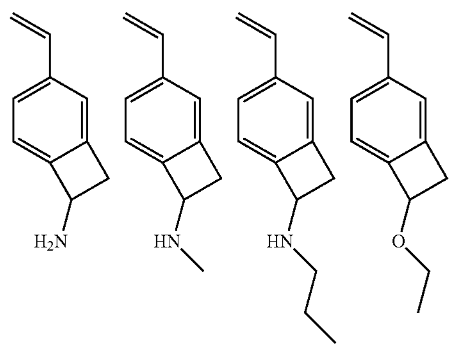

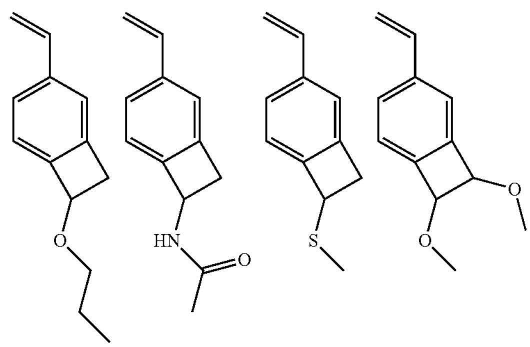

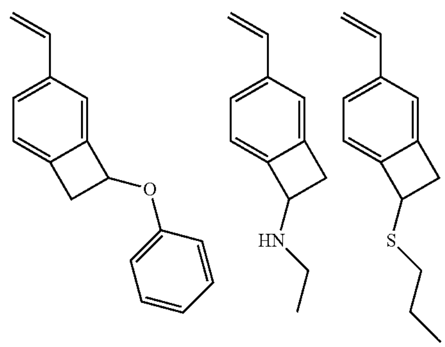

-continued

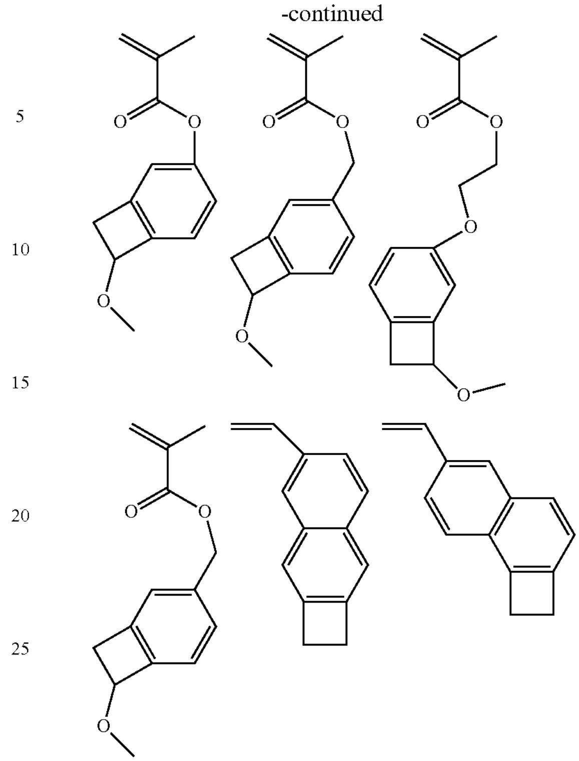

Suitable arylcyclobutene monomers also include, for example, unsaturated monomers which form the linking group represented by Formula 2:

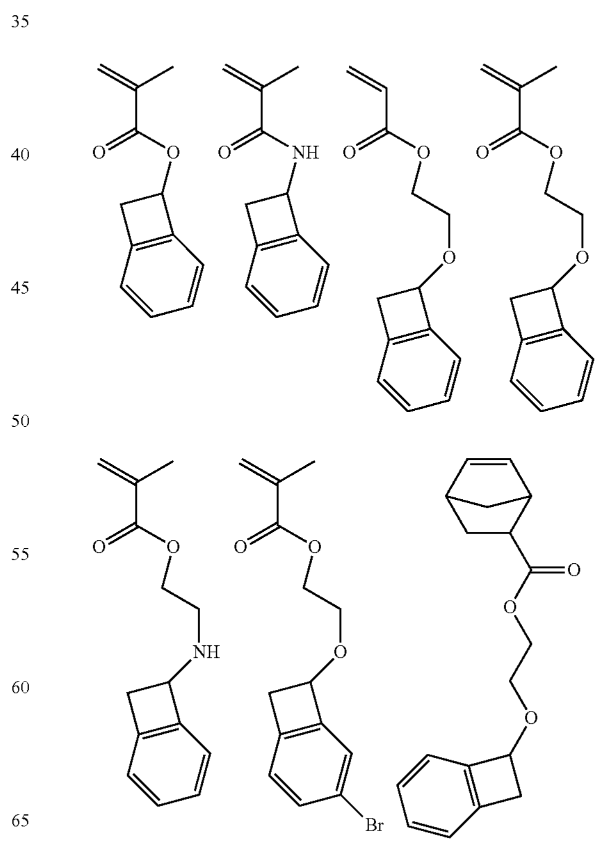

-continued
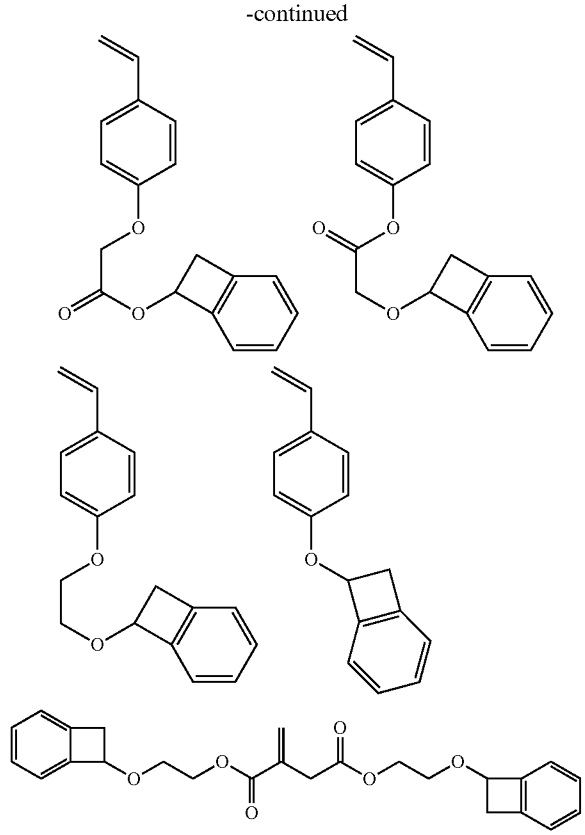
Suitable arylcyclobutene monomers also include, for example, heteroatom-containing monomers which form the linking group represented by Formula 1:
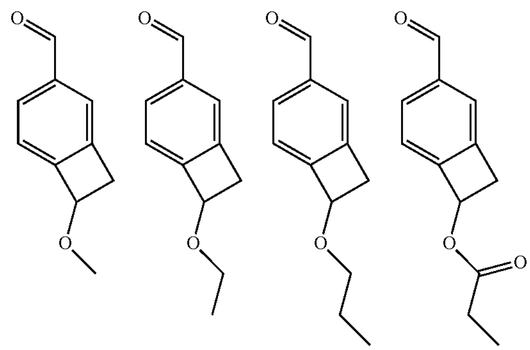
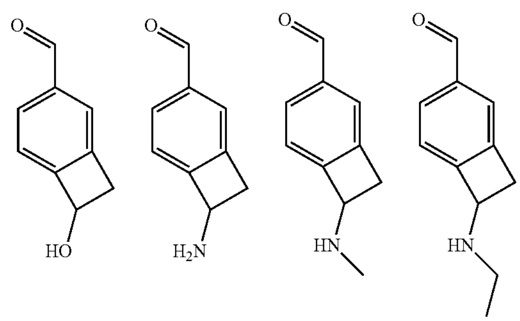
-continued
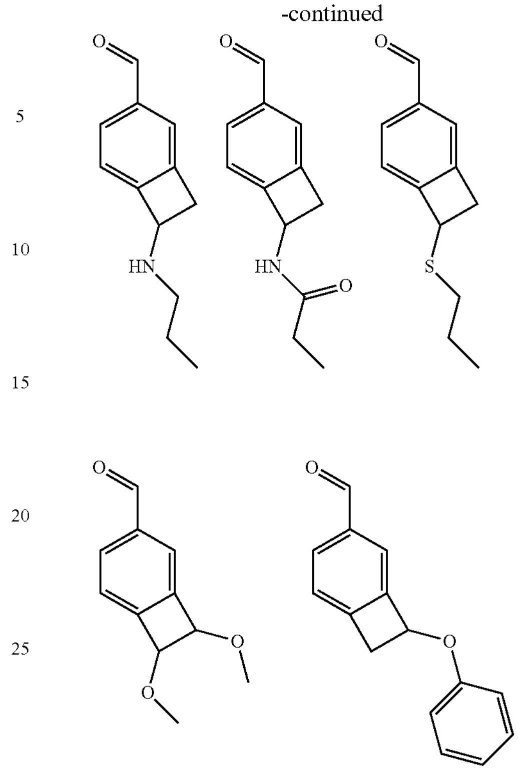
Suitable heteroatom-containing arylcyclobutene monomers include, for example, heteroatom-containing monomers which form the linking group represented by Formula 2:
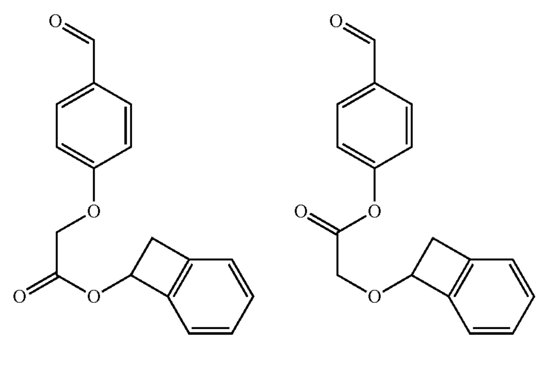
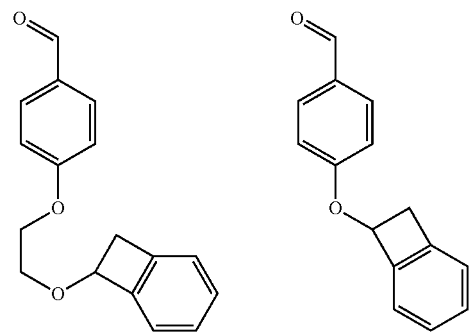

The above monomers may be polymerized to form a prepolymer. Suitable prepolymers include, for example, the following (ratios in mole %):
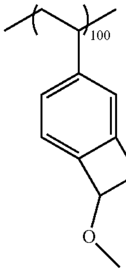
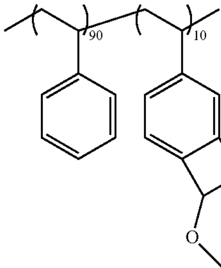
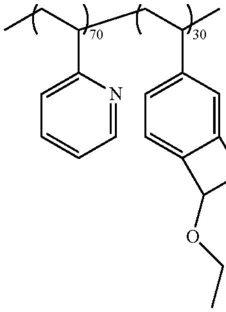
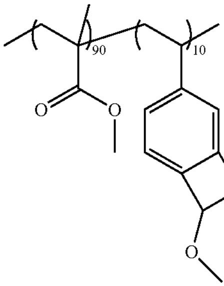
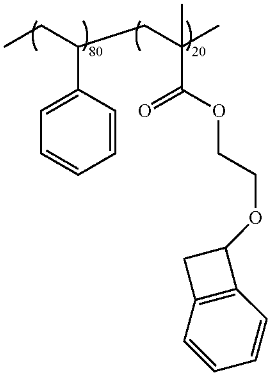
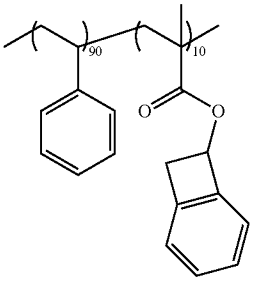
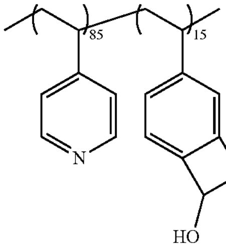
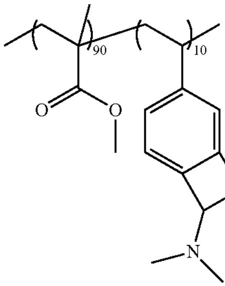
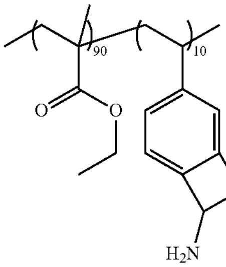
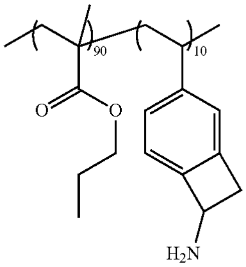
-continued
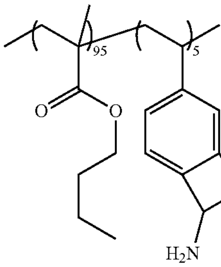
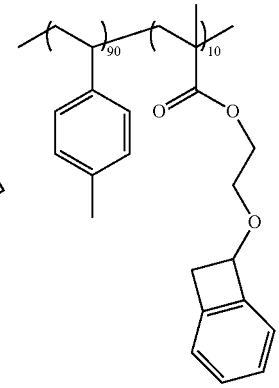
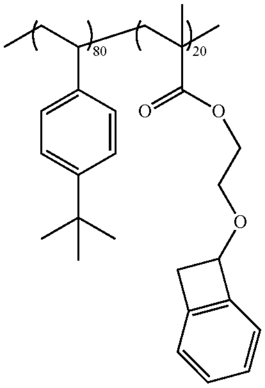
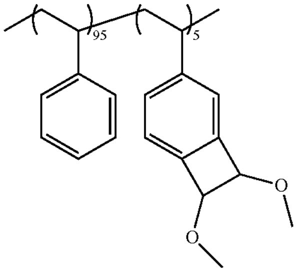
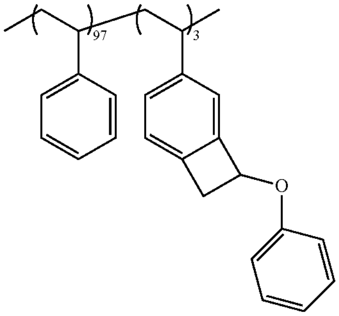
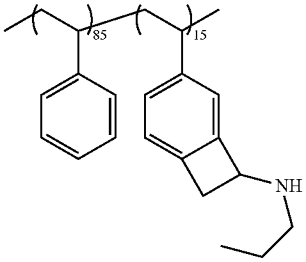

-continued

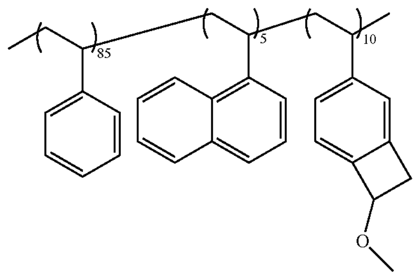

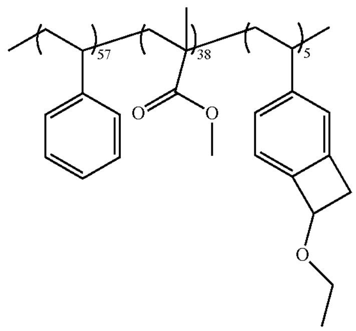

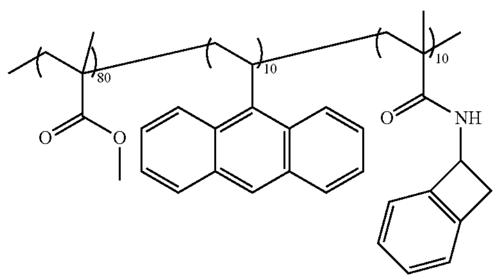

A reaction of the pendant group of the prepolymer with the fullerene may be a cycloaddition reaction. As shown in Scheme 5, a cyclobutene linking group precursor may undergo a ring opening to form a reactive diene intermediate which may undergo a cycloaddition reaction with fullerene to form the polymer:

Scheme 5

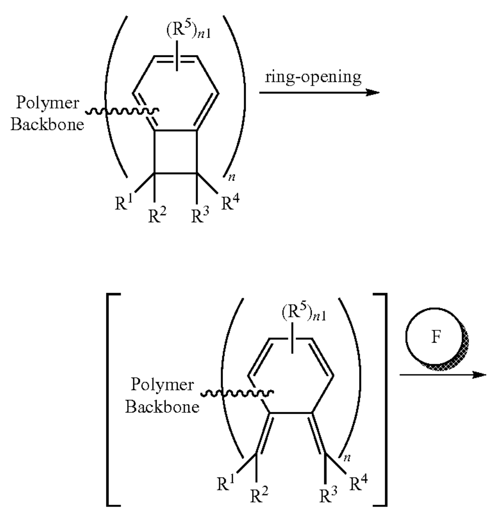

-continued

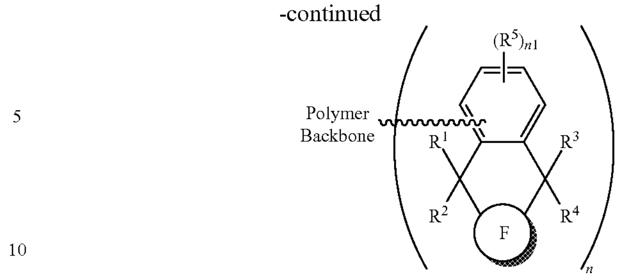

A cycloaddition reaction usually occurs as a result of the addition of one unsaturated entity to another to give a cyclic product in which all atoms are conserved in the final product. The two (or more) entities may reside on a single molecule or on multiple molecules. Without wishing to be bound by theory, it is believed that the addition reaction may be explained by assuming that the flow of electron density takes place from the highest occupied molecular orbital (HOMO) of one entity to the lowest unoccupied molecular orbital (LUMO) of the other entity.

In accordance with the subject matter disclosed herein, fullerenes may be attached to a variety of the linking group precursors via cycloaddition reactions across double bonds by a diene or analogous group to form a ring structure that utilizes two or more atoms on the fullerene. For example, in an embodiment, a diene or a hetero-analog thereof may add across a double bond on the fullerene via a cycloaddition reaction, to form a bridge across a pair of vertices wherein two 6-membered rings meet to form a so-called [6, 6] bridge. In another embodiment, [6, 5] substitution in the vertices between a 6-membered-ring and a 5-membered-ring by the diene group or diene precursor group may occur. Synthesis techniques for cycloadditions of this kind may be found in Hirsch, et al., "Fullerenes: Chemistry and Reactions," WILEY-VCH Verlag GmbH and Co., Weinheim, Chapter 4, (2005), Diederich et al., *Science,* 271, 317, (1996), Filippone et al., "Exohedral Fullerenes," *Encyclopedia of Polymeric Nanomaterials*, Springer-Verlag, Berlin, Heidelberg, pp. 1-16, (2014), and Yang et al., *J. Org. Chem.,* 78, 1163, (2013).

The polymer according to the embodiments may be obtained by [4+2] cycloaddition reactions with dienes or via cycloaddition reactions with diene precursors. The diene precursor may be a substituted or unsubstituted cyclobutene moiety fused to an aromatic group, which may undergo a ring opening to form a diene (the cyclobutene can be considered as a masked diene). One or more substituents may be attached to the cyclobutene moiety to facilitate the ring opening. The diene precursor may also be a moiety including a halogen or a hydroxyl group, which are believed to be lost by single elimination reactions such as dehydrohalogenation, dehydration and the like, thus forming a diene reactant. In addition to hydroxy groups, other groups may afford sufficient reactivity. These groups, herein denoted as leaving groups, may include, without limitation, carboxylic acid esters of hydroxy groups, sulfonic acid esters, phosphonic acid esters, alkyl, aryl, and alkylaryl carboxylate esters, halogens, cyanide, isocyanide, cyanate, isocyanate, thiocyanate, isothiocyanate, hypothiocyanite, selenocyanate, azide, trinitromethanide, and tricyanomethanide and the like.

In addition to single elimination reactions, double or multiple elimination reactions may be used to generate a stable or transient diene. For example, a variety of 1,2-bis (halomethyl) compounds such as 1,2-bis(bromomethyl)

benzene, substituted 1,2-bis(bromomethyl) benzene, and the like may form dienes in situ, by reacting with KI and a phase transfer catalyst, followed by single or multiple Diels Alder reactions with fullerenes, usually on [6,6] sides but possibly at [6,5] sides. Fullerenes of different carbon atom number undergo similar reactions. Phase transfer catalysts such as crown ethers, for example, 1,4,7,10,13,16-hexaoxacyclooctadecane (18-crown-6), or quaternary ammonium salts, for example, tetra-n-butyl-ammonium iodide ($Bu_4NI$) may be used to promote the reaction. Such reactions are described in Taylor, "Lecture Notes On Fullerene Chemistry: A Handbook For Chemists," Imperial College Press, London, pp. 177 ff., (1999) and Langa et al., "Fullerenes: Principles and Applications," RSC Publishing, Cambridge, pp. 21 ff., (2007). In addition to substituted halogens, there may be an advantage to using one or more of the other leaving groups described above. Using such techniques, one may form (m, m+1)-dimethylene-(m, m+1)-dihydro-W aromatic and heteroaromatic compounds, where m denotes the location of a methylene group. Examples of W include, without limitation, benzene, naphthalene, thiophene, pyrrole (1H, and 2H), pyrazole, triazole, thiadiazole, oxadiazole, imidazole, pyridine, and the like. Exemplary dienes which may be formed in this way include without limitation, 2,3-dimethylene-2,3-dihydrobenzene, 2,3-dimethylene-2,3-dihydronaphthalene, 2,3-dimethylene-2,3-dihydrophenanthrene, 2,3-dimethylene-2,3-dihydropyridine, and the like.

Other reaction schemes may be useful in forming useful dienes. For example, 1,4-dihydrophthalazine may be used to form 2,3-dimethylene-2,3-dihydrobenzene by thermally eliminating $N_2$. Other examples of diene precursors include, without limitation, 1,3-dihydro-2-benzothiophene 2,2-dioxide, 1,4-dihydro-2,3-benzoxathiine 3-oxide. The latter two precursors form 2,3-dimethylene-2,3-dihydrobenzene by eliminating $SO_2$ as a gas or nascent gas. Exemplary dienes which may be formed in this way include without limitation, 2,3-dimethylene-2,3-dihydrobenzene, 2,3-dimethylene-2,3-dihydronaphthalene, 2,3-dimethylene-2,3-dihydrophenanthrene, 2,3-dimethylene-2,3-dihydropyridine, and the like. Such reactions are described in Chung et al., *J. Chem. Soc., Chem Commun.*, (1995), 2537, and Beer et al., *J. Mater. Chem.*, (1997), 7, 1327. Using such techniques, one may form (m, m+1)-dimethylene-(m, m+1)-dihydro-W aromatic and heteroaromatic compounds, where m denotes the location of a methylene group. Examples of W include, without limitation, benzene, naphthalene, thiophene, pyrrole (1H, and 2H), pyrazole, triazole, thiadiazole, oxadiazole, imidazole, pyridine, and the like. Exemplary dienes which may be formed in this way include without limitation, 2,3-dimethylene-2,3-dihydrobenzene, 2,3-dimethylene-2,3-dihydronaphthalene, 2,3-dimethylene-2,3-dihydrophenanthrene, 2,3-dimethylene-2,3-dihydropyridine, and the like.

In addition to cycloaddition reactions with dienes, usually, [4+2] cycloaddition reactions, [3+2] cycloaddition reactions may yield singly and multiply substituted thermal products via ylide intermediates and dipolar compounds, using pnictogen compounds such as diazides, azomethines, nitrones, amines, phosphines, arsines, stilbines, and isoelectronic or electronically equivalent analogs thereof. Such reactions may produce 5-membered homocyclic and heterocyclic rings. Exemplary compounds used for forming ylides include, without limitation, aryl phosphines, tri-n-alkyl phosphines, tri-isoalkyl phosphines, phosphines comprising mixed substituents such as aryl-di-isoalkyl phosphine and the like. Such reactions are known in the art. Details may be found in Prato et al., *J. Am. Chem. Soc.*, (1993), 115, 1594, Yang et al., Id. at 1163, ff., Coldham et al., *Chem. Rev.*, (2005), 105, 2765.

Photochemical [2+2] cycloaddition reactions with olefins may also be carried out resulting in singly and multiply substituted four-membered rings at the [6,6] position, and, possibly, the [6,5] position of the fullerene. A wide variety of solvents can be used to carry out the cycloaddition reaction, provided they are degassed to minimize reactions with ambient oxygen. Solvents or cosolvents such as acetone may be useful as triplet sensitizers. Reaction temperature may influence regioselectivity and stereoselectivity. It is usually beneficial to select the excitation wavelength so that the products do not absorb significantly. Suitable olefins include enones, ethylene, substituted ethylenes, acrylates, methacrylates and the like.

It should be noted that cycloaddition reactions may produce products having a variety of substitutions on the fullerene with various n values and a variety of different substitution patterns for each n value when n>1. A blend of such materials does not depart from the scope of the invention and may offer the advantage of enhanced solubility and a reduced propensity for crystallization.

A two-step synthesis of the Novolac polymer is illustrated in Scheme 6:

Scheme 6

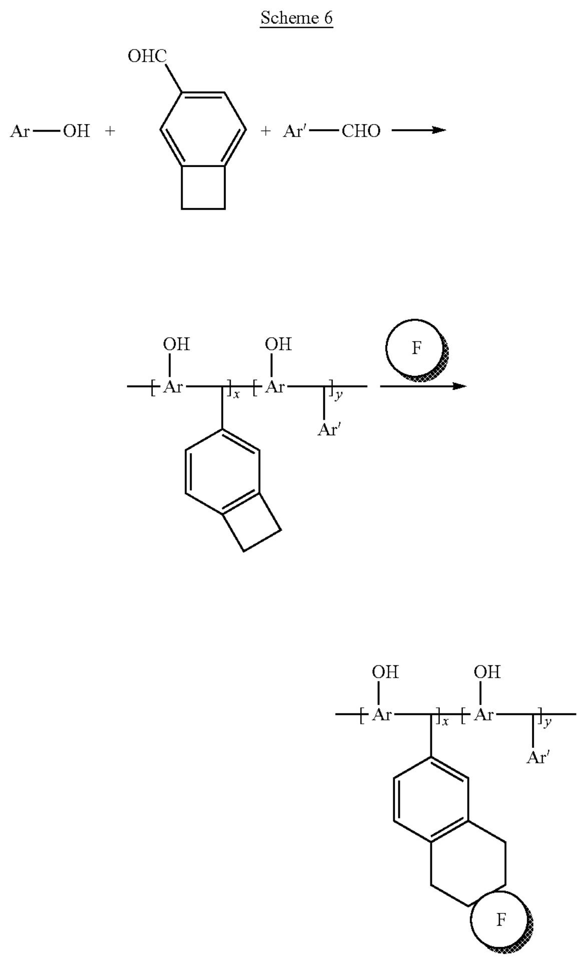

A synthesis of other exemplary polymers are shown in Schemes 7 to 10:

Scheme 7

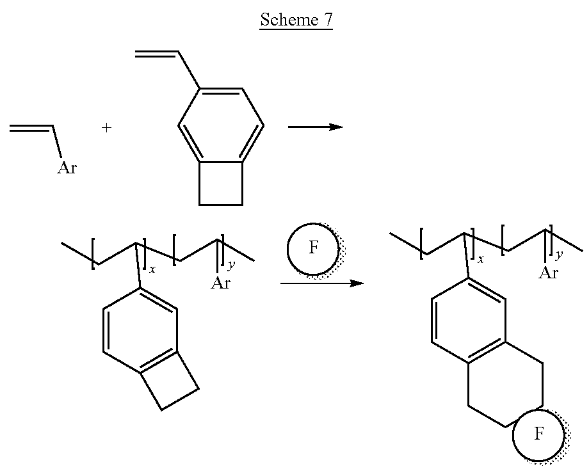

Scheme 8

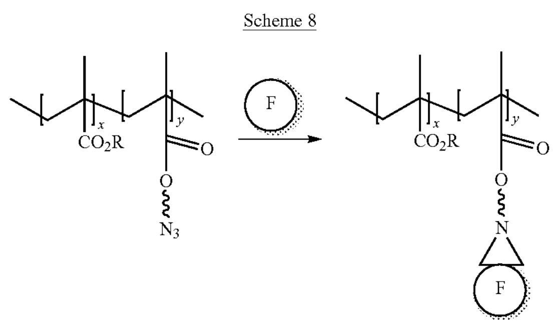

Scheme 9

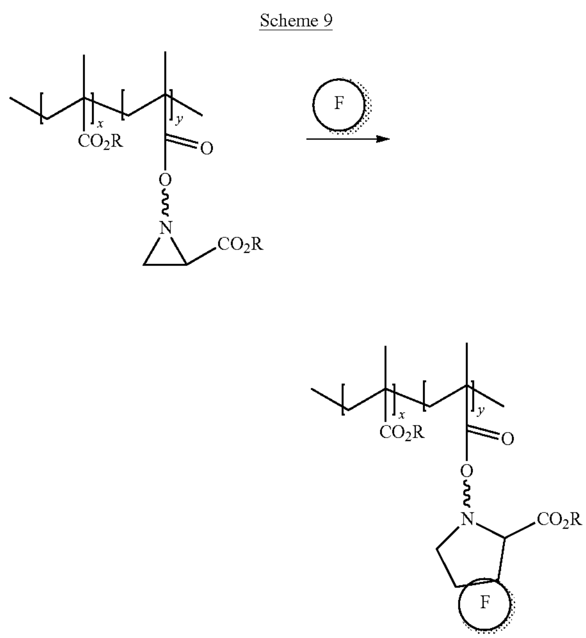

Scheme 10

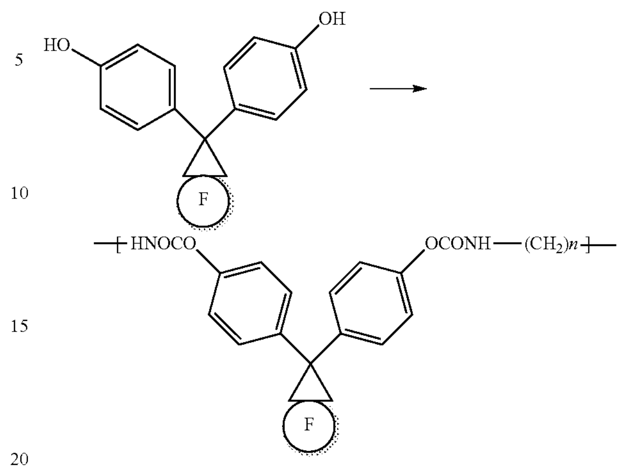

In Schemes 7 to 9, x and y are mole percentages of the corresponding structural units, such that the sum of x and y is 100. In Scheme 10, n is an integer of 1 to 20.

The free linking group precursor (not to react with fullerene) may advantageously be included in polymers to allow crosslinking. For example, some substituted free linking group precursors on the polymer may participate in crosslinking at lower temperatures.

The resist underlayer composition may further include a solvent. A solvent may an organic solvent typically used in the electronics industry, such as propylene glycol methyl ether (PGME), propylene glycol methyl ether acetate (PGMEA), methyl 3-methoxypropionate (MMP), ethyl lactate, n-butyl acetate, anisole, N-methyl pyrrolidone, gamma-butyrolactone, ethoxybenzene, benzyl propionate, benzyl benzoate, propylene carbonate, xylene, mesitylene, cumene, limonene, and mixtures thereof. Mixtures of organic solvents are may be used, such as a mixture including one or more of anisole, ethoxybenzene, PGME, PGMEA, GBL, MMP, n-butyl acetate, benzyl propionate and benzyl benzoate in combination with one or more additional organic solvents, and more preferably a mixture comprising two or more of anisole, ethoxybenzene, PGME, PGMEA, GBL, MMP, n-butyl acetate, benzyl propionate, xylene, mesitylene, cumene, limonene, and benzyl benzoate. When a mixture of solvents is used, the ratio of solvents is generally not critical and may vary from 99:1 to 1:99 weight-to-weight (w/w), provided that the solvent mixture is able to dissolve the components of the composition. It will be appreciated by those skilled in the art that the concentration of the components in the organic solvent may be adjusted by removing a portion of the organic solvent or by adding more of the organic solvent, as may be desired.

The solvent component of the composition is typically present in an amount of from 50 to 99.9 weight %, for example, from 55 to 99.9 weight %, from 60 to 99.9 weight %, from 65 to 99.9 weight %, from 70 to 99.9 weight %, from 75 to 99.9 weight %, from 80 to 99.9 weight %, from 85 to 99.9 weight %, from 90 to 99.9 weight %, or from 95 to 99 weight %, based on the total weight of the resist underlayer composition.

The underlayer composition may include one or more optional additives including, for example, surfactants and antioxidants. Typical surfactants include those which exhibit an amphiphilic nature, meaning that they may be both hydrophilic and hydrophobic at the same time. Amphiphilic surfactants possess a hydrophilic head group or groups, which have a strong affinity for water and a long hydrophobic tail, which is organophilic and repels water. Suitable surfactants may be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRTON® X-114, X-100, X-45, X-15 and branched secondary alcohol ethoxylates such as TERGITOL™ TMN-6 (The Dow Chemical Company, Midland, Michigain USA) and PF-656 (Omnova Solutions, Beachwood, Ohio, USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also may be suitable. Such surfactants are commercially available from Air Products and Chemicals, Inc. of Allentown, PA. and sold under the trade names of SURFYNOL® and DYNOL®. Additional suitable surfactants include other polymeric compounds such as the tri-block EO-PO-EO co-polymers PLURONIC® 25R2, L121, L123, L31, L81, L101 and P123 (BASF, Inc.). Such surfactant and other optional additives if used are typically present in the composition in minor amounts such as from 0.01 to 10 weight % based on total solids of the underlayer composition.

An antioxidant may be added to the underlayer composition to prevent or minimize oxidation of organic materials in the underlayer composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butylhydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butylanilino)2,4-bisoctyl-thio-1,3,5-triazine, n-octadecyl-3-(4'-hydroxy-3',5'-di-tert-butylphenyl)propionate, octylated phenol, aralkyl-substituted phenols, alkylated p-cresol and hindered phenol; bis-, tris- and polyphenols such as 4,4'-dihydroxydiphenyl, methylenebis (dimethyl-4,6-phenol), 2,2'-methylene-bis-(4-methyl-6-tert-butylphenol), 2,2'-methylene-bis-(4-methyl-6-cyclohexylphenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyldiphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl)propionate]methane. Suitable antioxidants are commercially available, for example, Irganox™ antioxidants (Ciba Specialty Chemicals Corp.). The antioxidants if used are typically present in the underlayer composition in an amount of from 0.01 to 10 weight % based on total solids of the underlayer composition.

The resist underlayer compositions include a self-crosslinkable polymer and a solvent, and may include one or more additional optional components. The self-crosslinkable polymer contains a first unit comprising a polymerized backbone and a crosslinkable group pendant to the backbone. As used herein, the term "self-crosslinkable" means that crosslinking reaction can occur between units of the same polymer without the aid of an additive catalyst or crosslinking agent. The crosslinking reaction may additionally take place between units of plural polymers, whether of the same or different types. The self-crosslinking reaction is typically effected by elevating the temperature of the self-crosslinkable polymer. When the polymer is self-crosslinkable, the underlayer composition may not require an additive crosslinking agent. Thus, the polymer, according to an embodiment, may include a crosslinking group that is capable of forming a fused ring system with the fullerene group. Such a crosslinking group may be, for example, an arylcyclobutene group pendant to the polymer backbone. As indicated above, the arylcyclobutene group on the polymer may function as a reactive moiety to form a covalent bond with the fullerene. The arylcyclobutene group on the polymer may also serve as a functionality for making the polymer self-crosslinkable or crosslinkable with an additive crosslinking agent. Preferably, the polymer is self-crosslinkable, and the underlayer composition is free of any additive crosslinking agents. In accordance with certain aspects of the invention, the self-crosslinking reaction can occur with no by-product. Such a crosslinking reaction may be beneficial from the standpoint of minimizing or preventing the occurrence of outgassing, which may be deleterious in view of void formation and/or the generation of defects.

The onset temperature ($T_o$) for crosslinking of the polymer will depend, for example, on whether the resist underlayer composition is free of, or includes, additive-type crosslinkers, as well as on the type of crosslinker used and crosslinkable groups on the polymer. The onset temperature is typically less than 350° C., for example, from 180 to 325° C., from 220 to 300° C., or from 230 to 250° C. Such a relatively low onset temperature would allow for crosslinking of the polymer at a relatively low temperature within a short time, thereby avoiding or minimizing problems such as thermal degradation and/or oxidation of the underlying layers and dewetting that may occur with the use of polymers having higher onset and crosslinking temperatures.

Another aspect of the present invention provides a coated substrate, including (a) a substrate; (b) a resist underlayer formed from the resist underlayer composition over the substrate; and (c) a photoresist layer over the resist underlayer. The coated substrate may further include a silicon-containing layer and/or an organic antireflective coating layer disposed above the resist underlayer and below the photoresist layer.

Yet another aspect of the present invention provides a method of forming a pattern. The method includes: (a) applying a layer of the resist underlayer composition over a substrate; (b) curing the applied resist underlayer composition to form a resist underlayer; and (c) forming a photoresist layer over the resist underlayer. The method may further include forming a silicon-containing layer and/or an organic antireflective coating layer above the resist underlayer prior to forming the photoresist layer. The method may further include patterning the photoresist layer and transferring the pattern from the patterned photoresist layer to the resist underlayer and to a layer below the resist underlayer.

The described above compositions may be used to deposit the polymer coating on a patterned semiconductor device substrate, where the polymer coating layer has a suitable thickness, such as from 10 nm to 500 μm, preferably from 25 nm to 250 μm, and more preferably from 50 nm to 125 μm, although such coatings may be thicker or thinner than these ranges depending on the particular application. The present compositions substantially fill, preferably fill, and more preferably fully fill, a plurality of gaps on a patterned semiconductor device substrate. An advantage of the present polymer coatings is that they planarize (form planar layers over a patterned substrate) and fill the gaps with substantially no voids being formed, and preferably without forming voids.

Preferably, after being coated on the patterned semiconductor device substrate surface, the resist underlayer composition is heated (soft baked) to remove any organic solvent present. Typical baking temperatures are from 80 to 170° C., although other suitable temperatures may be used. Such baking to remove residual solvent is typically done for approximately 30 seconds to 10 minutes, although longer or shorter times may suitably be used. Following solvent removal, a layer, film or coating of the resist underlayer on the substrate surface is obtained. Preferably, the resist underlayer is next cured to form a crosslinked film. Such curing is typically achieved by heating the resist underlayer to a temperature effective to crosslink the film, such as heating to a temperature, for example, of ≥240° C., ≥300° C., or ≥350° C. Such curing step may take from 30 seconds to 180 minutes, preferably from 30 seconds to 120 minutes, more preferably from 30 seconds to 60 minutes, and even more preferably from 30 to 300 seconds, although other suitable times may be used. Such curing step may be performed in an oxygen-containing atmosphere or in an inert atmosphere, and preferably in an inert atmosphere.

Optionally, an organic antireflectant layer may be disposed directly on the resist underlayer. Any suitable organic antireflectant may be used. As used herein, the term "antireflectant" refers to a moiety or a material that absorbs actinic radiation at the wavelength of use. Suitable organic antireflectants are those sold under the AR™ brand by Dow Electronic Materials (Marlborough, Mass.). The particular antireflectant used will depend on the particular photoresist used, the manufacturing process used, and on other considerations well within the ability of those skilled in the art. In use, the organic antireflectant is typically spin-coated onto the surface of the resist underlayer, followed by heating (soft baking) to remove any residual solvent and then curing to form an organic antireflectant layer. Such soft baking and curing steps may be performed in a single step.

A photoresist layer may then be deposited on the resist underlayer, such as by spin-coating. In a preferred embodiment, the photoresist layer is deposited directly on the resist underlayer (called a tri-layer process). In an alternate preferred embodiment, the photoresist layer is deposited directly on the organic antireflectant layer (called a quad-layer process). A wide variety of photoresists may be suitably used, such as those used in 193 nm lithography, such as those sold under the Epic™ brand available from Dow Electronic Materials. Suitable photoresists may be either positive tone development or negative tone development resists.

Optionally, one or more barrier layers may be disposed on the photoresist layer. Suitable barrier layers include a topcoat layer, a top antireflectant coating layer (or TARC layer), and the like. Preferably, a topcoat layer is used when the photoresist is patterned using immersion lithography. Such topcoats are well-known in the art and are generally commercially available, such as OC™ 2000 available from Dow Electronic Materials. It will be appreciated by those skilled in the art that a TARC layer is not needed when an organic antireflectant layer is used under the photoresist layer.

Following coating, the photoresist layer is then imaged (exposed) using patterned actinic radiation, and the exposed photoresist layer is then developed using the appropriate developer to provide a patterned photoresist layer. The photoresist is preferably patterned using an immersion lithography process, which is well-known to those skilled in the art. The pattern is next transferred from the photoresist layer to the underlayers by appropriate etching techniques known in the art, such as by plasma etching, resulting in a patterned resist underlayer. In a tri-layer process, the resist pattern is transferred into a silicon middle layer and then into the resist underlayer. In the case of a quad-layer process, the resist layer pattern is transferred to an organic antireflectant layer followed by sequential etch through a silicon middle layer into the resist underlayer using appropriate pattern transfer techniques, such as plasma etching. The resist underlayer is typically patterned using appropriate etching techniques, such as $O_2$ or $CF_4$ plasma. Any remaining patterned photoresist and organic antireflectant layers are removed during pattern transfer etching of the resist underlayer. Next, the pattern is transferred to a layer below the resist underlayer, such as by appropriate etching techniques, such as by plasma etching and/or wet chemical etching, to provide a patterned semiconductor device substrate. For example, the pattern may be transferred to the semiconductor device substrate. Resist underlayers of the invention preferably withstand wet chemical etch processes during pattern transfer to one or more layers below the resist underlayer. Suitable wet chemical etch chemistries include, for example, mixtures comprising ammonium hydroxide, hydrogen peroxide, and water (e.g., SC-1 clean); mixtures comprising hydrochloric acid, hydrogen peroxide, and water (e.g., SC-2 clean); mixtures comprising sulfuric acid, hydrogen peroxide, and water; mixtures comprising phosphoric acid, hydrogen peroxide, and water; mixtures comprising hydrofluoric acid and water; mixtures comprising hydrofluoric acid, phosphoric acid, and water; mixtures comprising hydrofluoric acid, nitric acid, and water; mixtures comprising tetramethylammonium hydroxide and water; and the like. The patterned semiconductor device substrate is then processed according to conventional means. As used herein, the term "underlayer" refers to all removable processing layers between the semiconductor device substrate and the photoresist layer, namely the optional organic antireflectant layer, silicon containing middle layer, and the resist underlayer.

The resist underlayer, according to an embodiment, may also be used in a self-aligned double patterning process. In such a process, a layer of an underlayer resist composition described above is coated on a substrate, such as by spin-coating. Any remaining organic solvent is removed and the coating layer is cured to form a resist underlayer. A suitable middle layer, such as a silicon-containing hardmask layer is optionally coated on the resist underlayer. A layer of a suitable photoresist is then coated on the middle layer, such as by spin coating. The photoresist layer is then imaged (exposed) using patterned actinic radiation, and the exposed photoresist layer is then developed using the appropriate developer to provide a patterned photoresist layer. The pattern is next transferred from the photoresist layer to the middle layer and the resist underlayer by appropriate etching techniques to expose portions of the substrate. Typically, the photoresist is also removed during such etching step. Next, a conformal silicon-containing layer is disposed over the patterned resist underlayer and exposed portions of the substrate. Such silicon-containing layer is typically an inorganic silicon layer such as SiON or $SiO_2$ which is conventionally deposited by CVD. Such conformal coatings result in a silicon-containing layer on the exposed portions of the substrate surface as well as over the underlayer pattern, that is, such silicon-containing layer substantially covers the sides and top of the underlayer pattern. Next, the silicon-containing layer is partially etched (trimmed) to expose a top surface of the patterned resist underlayer and a portion of the substrate. Following this partial etching step, the pattern on the substrate comprises a plurality of features, each feature comprising a line or post of the resist underlayer with the silicon-containing layer directly adjacent to the sides of each resist underlayer feature. Next, exposed regions of the resist underlayer are removed, such as by etching, to expose the substrate surface that was under the resist underlayer pattern, and providing a patterned silicon-containing layer on the substrate surface, where such patterned silicon-containing layer is doubled (that is, twice as many lines and/or posts) as compared to the patterned resist underlayer.

Films formed from preferred resist underlayer compositions of the invention show excellent thermal stability and improved adhesion to substrates. Preferred resist underlayers of the invention may, as a result, withstand wet chemical etch processes and chemistries such as described above.

The present inventive concept is further illustrated by the following examples. All compounds and reagents used herein are available commercially except where a procedure is provided below.

EXAMPLES

Polymer Synthesis

Example 1. Synthesis of P(ASM-r-VBCB) (79/21)

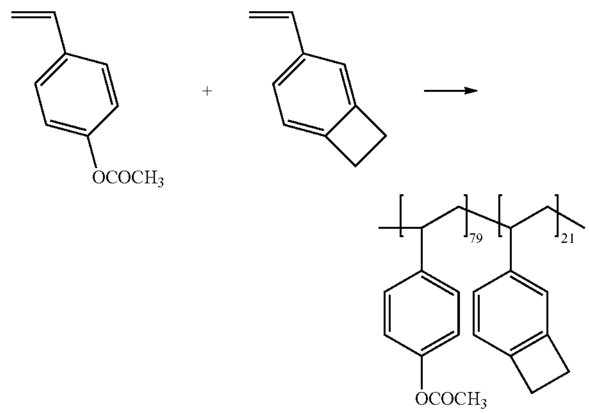

The following procedure may be used as a general protocol for synthesis of various starting polymers by free radical polymerization.

A solution of 4-acetoxystyrene (ASM), (41.64 g) and 4-vinyl benzocyclobutene (VBCB) (8.36 g) dissolved in PGME (38.19 g) and a solution of V-65 initiator (7.97 g) dissolved in PGME (7.97 g) were both added dropwise over 2 hours to PGME (89.10 g) at 75° C. under a nitrogen blanket. After addition, the reaction solution was held at 75° C. for an additional two hours, cooled to room temperature and precipitated into heptanes (3.8 L). The precipitated polymer was collected by vacuum filtration and vacuum oven dried at 50° C. for 24 hours to afford the desired polymer as a white solid (76%). $M_w$ was determined by GPC relative to polystyrene standard and was found to be 3500 Da, PDI=1.6.

Example 2. Synthesis of P(S-b-VBCB)C60 (90/0)/10

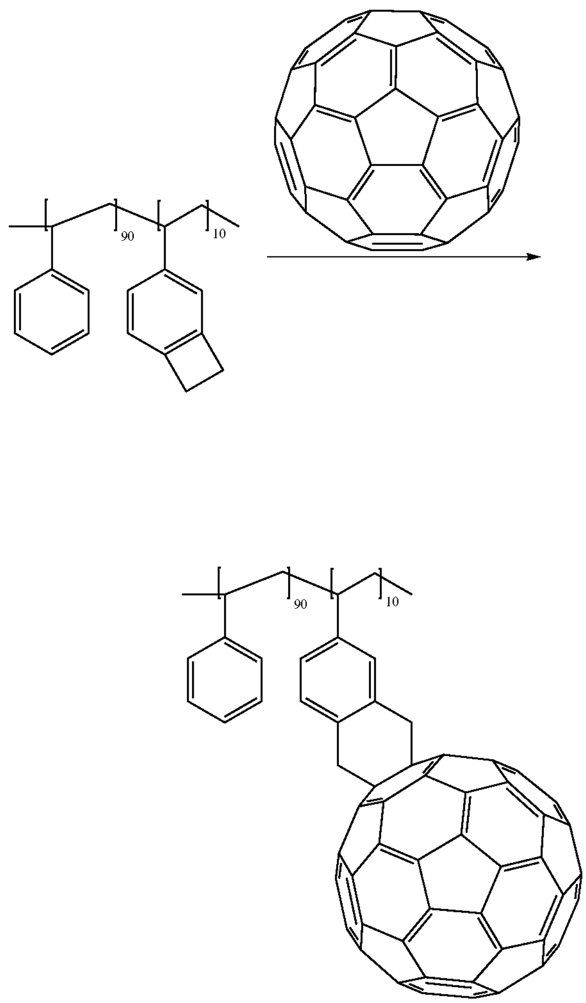

To a 500 mL flask was added 167 mL of 1,2,4-trichlorobenzene, 3.37 g of C60 fullerene and 5.0 g of P(S/VBCB 90/10) polymer. The reaction mixture was degassed with nitrogen for 30 minutes and heated at 150° C. for 12 h. The reaction was then cooled to room temperature and precipitated into methanol. The polymer was collected by vacuum filtration and vacuum oven dried for 12 hours at 50° C. to afford the desired polymer as a brown solid to give (PS-b-VBCB)C60 (6.9 g). $M_w$=41835, PDI=1.31.

Example 3. Synthesis of P(ASM-r-VBCB) C60 (79/8)/13

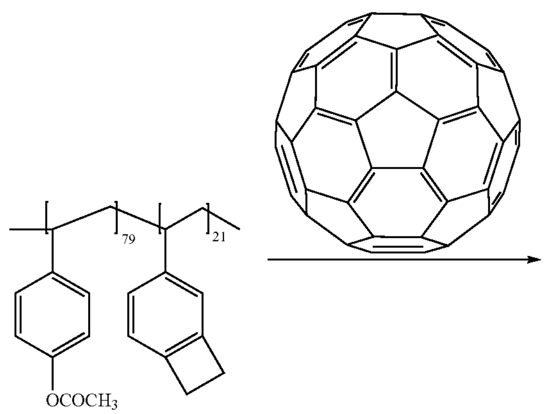

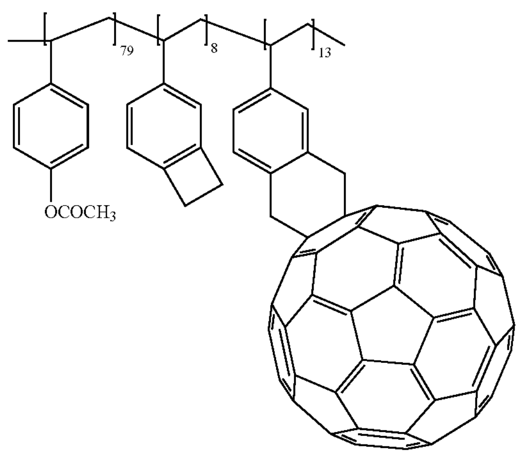

To a 500 mL flask was added 274 mL of 1,2-dichlorobenzene, 3.699 g C60 and 10.0 g P(S/VBCB 79/21) polymer. The reaction mixture was degassed with nitrogen for 30 minutes and heated at 150° C. for 3 h and then 170° C. for 24 h. The reaction was then cooled to room temperature and precipitated into methanol. The polymer was collected by vacuum filtration and vacuum oven dried for 12 hours at 50° C. to afford the desired polymer as a brown solid to give the desired polymer (12.8 g). $M_w$=5200, PDI=2.1.

Example 4. Synthesis of Synthesis of P(HS-r-VBCB) C60 (79/8)/13

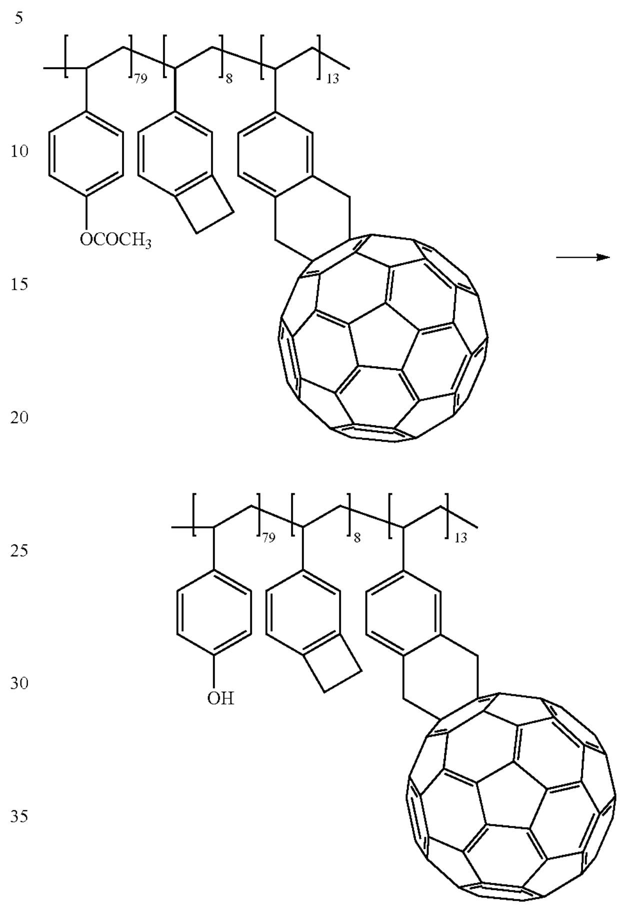

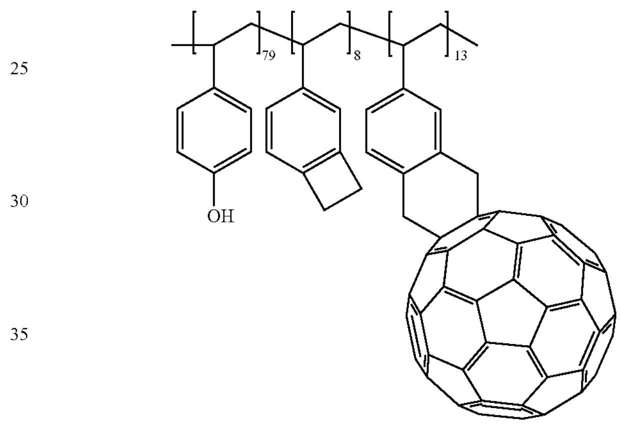

The polymer P(ASM/VBCB)C60 (79/8)13 (3 g) was weighed in a 3-necked flask and connected to a distillation setup, thermocouple, and $N_2$ atmosphere. Methanol (50 mL) and 0.3 mL of 30 weight % of NaOMe in MeOH were added, and reaction was heated to reflux conditions (~65° C.). The polymer was partially soluble in the solvent initially but with high temperature (and product formation), it became completely soluble. Over the duration of reaction (~6 h), the by product-methyl acetate and MeOH distilled out from the reaction, so extra methanol was added intermittently to the reaction. The progress of the reaction was confirmed by monitoring the chemical shift change of the phenyl-carbon connected to acetate. The polymer solution was taken in a nalgene bottle and 50 weight % C381 resin (DuPont Company) was added. The polymer solution was shaken at RT at 200 revolutions per minute (rpm) for 1 h. Then, the resin was filtered out and IRN150 (DuPont Company) 50 weight % was added and solution was shaken for 2 h. The solution was filtered and methanol was evaporated under reduced pressure. The polymer was re-dissolved in minimum amount of methanol ~15 mL and added slowly to a beaker containing ~500 mL of water. Dark brown solid immediately precipitated out. The polymer was washed with water, dried by filtration (~2 h), collected in a beaker and dried overnight in a vacuum oven at 45° C. Yield is 2.5 g. $M_w$=6365, PDI=2.0.

Example 5. Synthesis of P(ASM-r-VBCB) C60 (70/10)/20

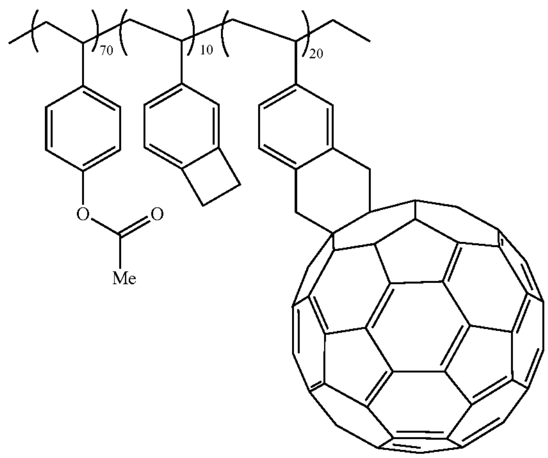

To a 500 mL flask was added 136 mL of 1,2-dichlorobenzene, 3.306 g C60 and 3.5 g P(ASM-r-VBCB 80/20) polymer. The reaction mixture was degassed with nitrogen for 30 minutes and reaction was heated at 170° C. for 20 h. The reaction was then cooled to room temperature and was precipitated into methanol. The polymer was collected by vacuum filtration and vacuum oven dried for 12 hours at 50° C. to afford the desired polymer as a brown solid to give the desired polymer (7.5 g). $M_w$=15013, PDI=2.9.

Example 6. Synthesis of P(S-ASM-r-VBCB) C60 (35/35/10)/20

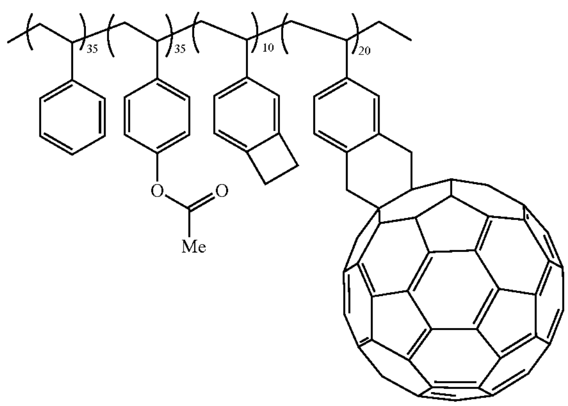

To a 500 mL flask was added 209 mL of 1,2-dichlorobenzene, 5.492 g C60 and 5.00 g P(S-r-ASM-VBCB 35/35/30) polymer (prepared in the same way as described in Example 1). The reaction mixture was degassed with nitrogen for 30 minutes and reaction was heated at 170° C. for 20 h. The reaction was then cooled to room temperature and was precipitated into methanol. The polymer was collected by vacuum filtration and vacuum oven dried for 12 hours at 50° C. to afford the desired polymer as a brown solid to give the desired polymer (10.5 g). $M_w$=21414, PDI=6.1.

Example 7. Synthesis of P(Py-NaCHO)$_m$-r-(Py-BCBCHO)$_n$, m=85, n=15

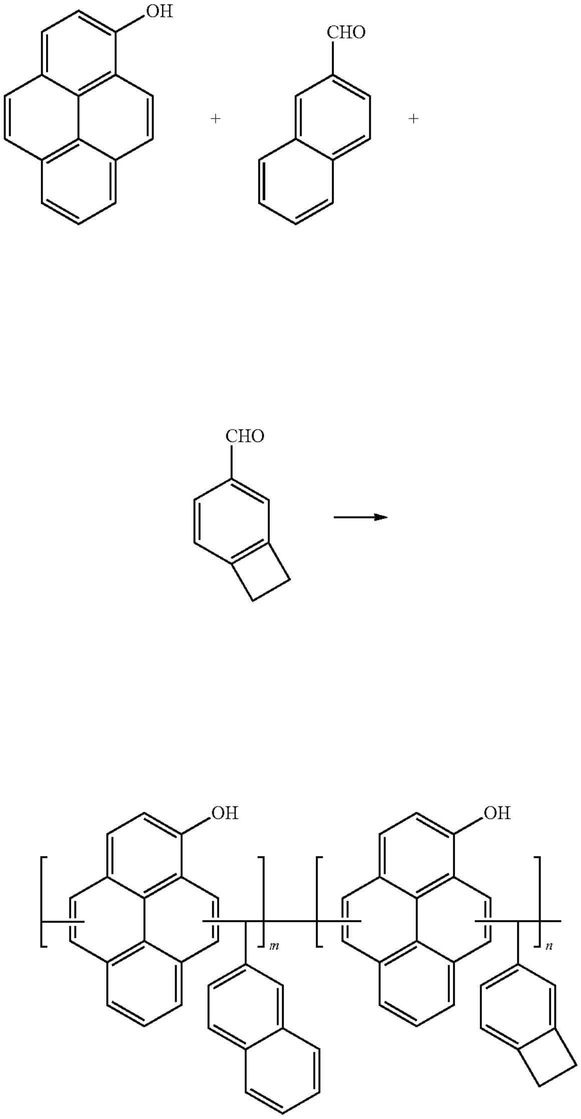

In a 100 mL round-bottomed flask was added 10.00 g of 1-pyrenol, 0.65 g of benzene benzocyclobutene 4-carboxaldehyde (BCB-aldehyde), 4.08 g of 2-naphthaldehyde, and 43 g of PGME. The flask was warmed to 60° C., then 1.48 g methane sulfonic acid was added in one portion to the stirring mixture. The reaction was equipped with a condenser and heated to 120° C. The reaction was left under reflux for 24 h stirring at 400 rpm. After 24 h, the reaction was cooled to 60° C. and precipitated into 800 mL 4/1 methanol/water (v/v) mixture. The brown solid was filtered off, washed in 4/1 methanol/water, and dried overnight in a vacuum oven. The polymer was collected as a brown solid in 9.5 g yield (64%). $M_w$=860 Da, PDI=1.1.

Example 8. Synthesis of P(Py-NaCHO)$_m$-r-(Py-BCBCHO)$_n$/C60 (m=85, n=15)/15

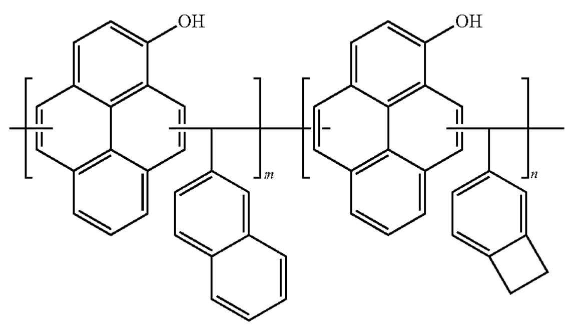

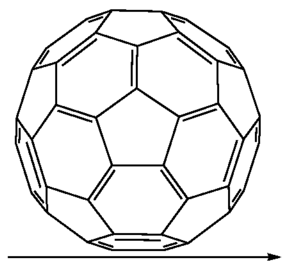

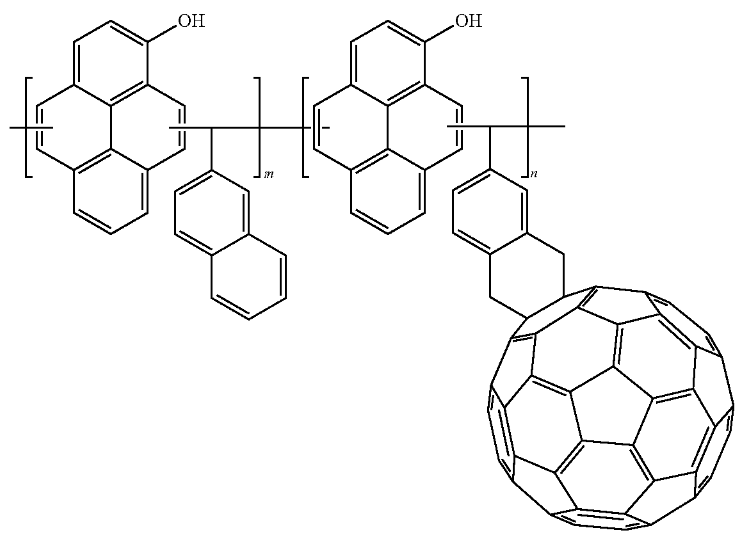

To a 500 mL flask was added 121 mL of 1,2-dichlorobenzene, 2.09 g C60 and 4.0 g P(Py-NaCHO)$_m$-r-(Py-BCBCHO)$_n$ (m=85, n=15) polymer. The reaction mixture was degassed with nitrogen for 30 minutes and reaction was heated at 170° C. for 24 h. The reaction was then cooled to room temperature and was precipitated into methanol. The polymer was collected by vacuum filtration and vacuum oven dried for 12 hours at 50° C. to afford the desired polymer as a brown solid to give the desired polymer (6.0 g). $M_w$=29700, PDI=6.2.

Polymer Solubility Studies

Solubility was evaluated by mixing a polymer of the present inventive concept with each of PGMEA and Anisole at 10 weight % solids. Those mixtures were visibly inspected. If there is no residue or precipitation in the polymer solution, the polymer was rated soluble ("S") and if there is residue or precipitation in solution, it was rated not soluble ("NS"). The results are reported in Table 1. As can be seen from these data, the polymers of the invention are soluble at 10 weight % in PGMEA and Anisole, whereas Comparative Compound 1 (di(HMBCB)-C60) did not completely dissolve at 10 weight % in either PGMEA or anisole.

TABLE 1

| Entry No. | Polymer | PGMEA | Anisole |
|---|---|---|---|
| 1 | P(ASM-r-VBCB)/C60 79/8/13 | S | S |
| 2 | P(HS-r-VBCB)/C60 79/8/13 | S | S |
| 3 | Comparative 1 (di(HMBCB)-C60) | NS | NS |

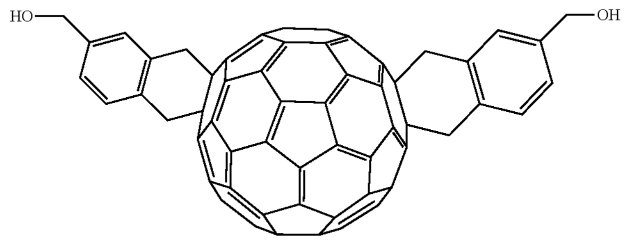

Comparative 1: di(HMBCB)-C60

Formulation

SOC formulations were prepared by dissolving the SOC polymers in PGMEA at 5.0 weight % unless otherwise noted. Hexamethoxymethylmelamine (HMMM) was added at 7.5 weight % (w/w HMMM/polymer) and used as a crosslinker. Triethylammonium para-toluenesulfonate (TEA-pTSA) was added at 0.1 weight % (w/w TEA-pTSA/polymer) and used as thermal acid generator (TAG). Surfactant PF656, and high boiling point solvent, benzyl benzoate (BB), were introduced for all formulations. The obtained solutions were filtered through a Teflon syringe filter (pore size: 0.2 um) prior to coating.

Etch Performance

All the etch tests are carried out using a Plasma-Therm 790 etch cool. The SOC material was coated and cured with 1000 Å film thickness prior to etching. The Plasma-Therm 790 was configured for RIE (Reactive Ion Etching) processing of Silicon substrates. Substrates up to 8 inches in diameter are manually loaded into the Process Chamber. Process variables are saved in recipe files on the control computer hard drive. All system operation and process recipe steps are completed automatically under Computer Control. Etch recipe was listed below. A 1-pyrnenol and 2-naphthaldehyde condensate polymer was used as a reference polymer for etch test.

For $Ar/O_2$ etch condition, 60 sccm of Ar gas and 20 sccm of $O_2$ gas were used with 300 W of power under 10 mTorr of pressure. Each example each sample was etched for 30 sec, 50 sec and 70 sec.

For $Ar/CF_4$ etch condition, 20 sccm of Ar gas and 50 sccm of $O_2$ gas were used with 500 W of power under 10 mTorr of pressure. Each example each sample was etched under 90 sec, 150 sec and 180 sec.

Etch rate (Å/sec)=[(film thickness before etching,Å)−(film thickness after etching,Å)]/etch time (sec)

Normalized Etch rate=Etch rate of example/etch rate of ref.

The results of the etch performance are summarized in Table 2:

TABLE 2

| | | | | | | | Normalized Etch rate | |
|---|---|---|---|---|---|---|---|---|
| | | | Etch rate (Å/sec) | | | | Example | Example |
| Entry No. | Polymer | Formulation solvent | Ref. $Ar/O_2$ | Example $Ar/O_2$ | Ref. $CF_4/Ar$ | Example $CF_4/Ar$ | $Ar/O_2$ Norm. | $CF_4/Ar$ Norm. |
| 1 | PS-r-PVBCB 90/10 (comparative) | cyclohexanone/BB 97/3 | 8.4 | 12.2 | 3.5 | 4.8 | 1.45 | 1.37 |
| 2 | PS-r-PVBCB/C60 90/0/10 | cyclohexanone/BB 97/3 | 8.4 | 6.5 | 3.5 | 2.4 | 0.77 | 0.69 |
| 3 | P(ASM-r-VBCB) 79/21 (comparative) | PGMEA/BB 97/3 | 8.4 | 18.6 | 3.5 | 6.3 | 2.21 | 1.80 |
| 4 | P(HS-r-VBCB)/C60 79/8/13 | PGMEA/BB 97/3 | 7 | 8.6 | 3.5 | 3.8 | 1.23 | 1.09 |
| 5 | P(ASM-r-VBCB) 70/30 (comparative) | PGMEA/BB 97/3 | 9 | 16.9 | 3.3 | 5.7 | 1.88 | 1.73 |
| 6 | P(ASM-r-VBCB) C60 (70/10)/20 | anisole/BB 97/3 | 9 | 7.3 | 3.3 | 3.2 | 0.81 | 0.97 |
| 7 | P(S-ASM-r-VBCB) C60 (35/35/10)/20 | anisole/BB 97/3 | 9.3 | 8.3 | 3.8 | 3.4 | 0.89 | 0.89 |

TABLE 2-continued

| Entry No. | Polymer | Formulation solvent | Etch rate (Å/sec) Ref. $Ar/O_2$ | Example $Ar/O_2$ | Ref. $CF_4/Ar$ | Example $CF_4/Ar$ | Normalized Etch rate Example $Ar/O_2$ Norm. | Example $CF_4/Ar$ Norm. |
|---|---|---|---|---|---|---|---|---|
| 8 | P(Py-NaCHO)m-r-(Py-BCBCHO)n (m = 85, n = 15) (Comparative) | PGMEA/BB 97/3 | 9 | 8.3 | 3.3 | 3.3 | 0.92 | 1.00 |
| 9 | P(Py-NaCHO)m-r-(Py-BCBCHO)n/C60 (m = 85, n = 15)/15 | anisole/BB 97/3 | 7.7 | 6.7 | 3.3 | 3.3 | 0.87 | 1.00 |

The formulation of C60 polymers have improved etch resistance (~50% slower ER) compared to styrene polymers. All the examples have slower etch rate than the starting polymers with no fullerene attached.

Film Density

X-Ray Reflectivity (XRR) was used for uniform thin film measurement. Reflectivity data were collected using a Panalytical Empyrean diffractometer equipped with Cu-radiation. The incident optics included a parallel beam focusing mirror with a 1/16° incident slit. The receiving optics consisted of a proportional detector with 0.18 mm parallel plate collimator and matching reflectivity slit. An automated attenuator was used with a mini-prop detector. Data were analyzed using the Panalytical Reflectivity program and is listed in Table 3. The top polymer layer was refined for density, thickness and roughness while the substrate was only refined for roughness. In some cases, the density was fixed based on a visual inspection of the critical angle and first few fringes. As can be seen from these data, the polymer of the invention has a film density of 1.23, which is much higher than the P(PS-ASM-r-VBCB) (35/35/30).

TABLE 3

| Entry No. | Polymer | Film density |
|---|---|---|
| 1 | P(PS-ASM-r-VBCB) C60 (35/35/10)/20 | 1.23 |
| 2 | P(PS-ASM-r-VBCB) (35/35/30) (Comparative) | 1.04 |

Coating Quality

Compositions containing P(ASM-r-VBCB)/C60 were prepared in PGMEA/benzyl benzoate (w/w 97/3) at 4.0% solids. Comparative Compound 1 (BCB-C60) was prepared in anisole/benzyl benzoate (w/w 97/3) at 1.9% solids. Each composition was spin-coated on an 8" (200 mm) silicon wafer at a rate of 1500 rpm using an ACT-8 Clean Track (Tokyo Electron Co.), and then baked to form a cured film. Coating quality was evaluated by visually inspecting the film, and the results are reported in Table 4. As may be seen from the data, films formed from the polymers according to embodiments of the invention resulted in good film coating quality when cured at 250 and 300° C., whereas Comparative Compound 1 (di(HMBCB)-C60) did not form a good film with good uniformity.

TABLE 4

| Entry No. | Polymer (Film cure temperature/time) | Coating Quality |
|---|---|---|
| 1 | P(ASM-r-VBCB)/C60 79/8/13 (250° C./90 s) | Good |
| 2 | P(ASM-r-VBCB)/C60 79/8/13 (300° C./90 s) | Good |
| 3 | Comparative 1 di(HMBCB)-C60 (250° C./90 s) | Poor |
| 4 | Comparative 1 di(HMBCB)-C60 (300° C./90 s) | Poor |

Film Self-Crosslinking

Solvent strip resistance was measured as an indication of film crosslinking. Compositions containing P(ASM-r-VBCB)/C60 were prepared in PGMEA/benzyl benzoate (w/w 97/3) at 4.0% solids. Comparative Compound 1 (BCB-C60) was prepared in anisole/benzyl benzoate (w/w 97/3) at 1.9% solids. Each composition was spin-coated on an 8" (200 mm) silicon wafer at a rate of 1500 rpm using ACT-8 Clean Track (Tokyo Electron Co.), and then baked at the temperature reported in Table 4 for 90 seconds to form a film. Initial film thickness was measured using an OptiProbe™ from Therma-Wave Co. Next, a solvent remover PGMEA was applied to each of the films for 90 seconds followed by a post strip baking step at 105° C. for 60 seconds. The thickness of each film following post strip baking was again measured to determine the amount of film thickness lost. The difference in film thickness before and after contact with the remover is reported in Table 5 as the percentage of film thickness remaining. As may be seen from the data, films formed from the compounds according to embodiments of the invention retained greater than 99% of their thickness when cured at 300° C., whereas Comparative Compound 1 (di(HMBCB)-C60) did not form a good film and did not have PGMEA solvent strip resistance after contact with the remover.

TABLE 4

| Entry No. | Polymer (film cure temperature) | % Film Remaining |
|---|---|---|
| 1 | P(ASM-r-VBCB)/C60 79/8/13 (250° C.) | 2.2 |
| 2 | P(ASM-r-VBCB)/C60 79/8/13 (300° C.) | 99.7 |

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A coated substrate, comprising:

a substrate;

a resist underlayer formed from a resist underlayer composition; and a photoresist layer over the resist underlayer, wherein the resist underlayer composition comprises:

a polymer comprising a polymer backbone and a substituted or unsubstituted $C_{50}$ to $C_{120}$ fullerene group pendant to the polymer backbone, and a solvent in an amount of from 50 to 99.9 weight % based on the total resist underlayer composition, wherein the resist underlayer composition is free of additive crosslinking compounds, wherein the polymer further comprises a linking group bonded to the fullerene group and to the polymer backbone, wherein the linking group comprises a ring structure that utilizes two or more atoms on the fullerene group, and wherein the polymer is a polyalkylene, a polyalkylene oxide, a polyarylene, a Novolac polymer, a vinyl aromatic polymer, a (meth)acrylate polymer, a polyester, a norbornene polymer, a polyimide, a combination thereof, or a copolymer thereof.

2. The coated substrate of claim 1, wherein the polymer is self-crosslinkable, wherein the self-crosslinkable polymer refers to a polymer capable of undergoing a crosslinking reaction between units thereof without an aid of an additive catalyst or a crosslinking agent.

3. The coated substrate of claim 1, wherein the polymer further comprises an arylcyclobutene group pendant to the polymer backbone.

4. The coated substrate of claim 1, wherein the linking group comprises:

a substituted or unsubstituted $C_{3-20}$ alicyclic group or a $C_{2-20}$ heteroalicyclic group that forms a fused ring with the fullerene group, and a $C_{6-20}$ aromatic group or a $C_{3-20}$ heteroaromatic group that is fused to the $C_{3-20}$ alicyclic group or the $C_{2-20}$ heteroalicyclic group.

5. The coated substrate of claim 1, wherein the polymer comprises the reaction product of a substituted or unsubstituted fullerene with a substituted or unsubstituted arylcyclobutene group that is pendant to a precursor polymer backbone.

6. The coated substrate of claim 1, wherein the linking group is represented by Formula 1:

Formula 1

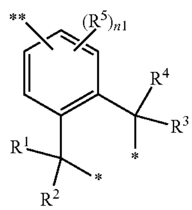

wherein, $R^1$ to $R^5$ are each independently hydrogen, deuterium, a substituted or unsubstituted $C_{1-20}$ linear or branched alkyl group, a substituted or unsubstituted $C_{6-20}$ aryl group, a substituted or unsubstituted $C_{7-20}$ arylalkyl group, a substituted or unsubstituted $C_{3-20}$ heteroaryl group, a substituted or unsubstituted $C_{3-30}$ heteroarylalkyl group, a substituted or unsubstituted $C_{3-30}$ cycloalkyl group, a substituted or unsubstituted $C_{3-30}$ heterocycloalkyl group, a $C_{1-20}$ alkoxy group, a hydroxy group, —$NH_2$; —NRR' (wherein R and R' are independently hydrogen or a $C_{1-20}$ linear or branched alkyl group, an isocyanate group, a halogen, —ROR' (wherein R is a substituted or unsubstituted $C_{1-20}$ alkylene group and R' is hydrogen or a $C_{1-20}$ linear or branched alkyl group, —RC(═O)X (wherein R is a substituted or unsubstituted alkylene group and X is a halogen), —C(═O)OR' (wherein R' is hydrogen or a $C_{1-20}$ linear or branched alkyl group), —OC(═O)R' (wherein R' is hydrogen or a $C_{1-20}$ linear or branched alkyl group), —CN, —OC(═O)NRR' (wherein R and R' are independently hydrogen or a $C_{1-20}$ linear or branched alkyl group), —S(═O)R' (wherein R' is hydrogen or a $C_{1-20}$ linear or branched alkyl group), and —$S(═O)_2R'$ (wherein R' is hydrogen or a $C_{1-20}$ linear or branched alkyl group), provided that each $R^5$ is not hydrogen, any two adjacent groups selected from $R^1$ to $R^5$ are optionally connected to form a ring;

n1 is 0, 1, 2, or 3;

** indicates a point of attachment directly or indirectly to the polymer backbone; and

* indicates a point of attachment to the fullerene group.

7. The coated substrate of claim 1, wherein the linking group is represented by Formula 2:

Formula 2

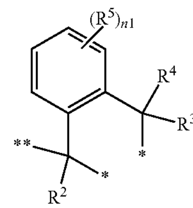

wherein, $R^2$ to $R^5$ are each independently hydrogen, deuterium, a substituted or unsubstituted $C_{1-20}$ linear or branched alkyl group, a substituted or unsubstituted $C_{6-20}$ aryl group, a substituted or unsubstituted $C_{7-20}$ arylalkyl group, a substituted or unsubstituted $C_{3-20}$ heteroaryl group, a substituted or unsubstituted $C_{3-30}$ heteroarylalkyl group, a substituted or unsubstituted $C_{3-30}$ cycloalkyl group, a substituted or unsubstituted $C_{3-30}$ heterocycloalkyl group, a $C_{1-20}$ alkoxy group, a hydroxy group, —$NH_2$; —NRR' (wherein R and R' are independently hydrogen or a $C_{1-20}$ linear or branched alkyl group, an isocyanate group, a halogen, —ROR' (wherein R is a substituted or unsubstituted $C_{1-20}$ alkylene group and R' is hydrogen or a $C_{1-20}$ linear or branched alkyl group, —RC(═O)X (wherein R is a substituted or unsubstituted alkylene group and X is a halogen), —C(═O)OR' (wherein R' is hydrogen or a $C_{1-20}$ linear or branched alkyl group), —OC(═O)R' (wherein R' is hydrogen or a $C_{1-20}$ linear or branched alkyl group), —CN, —OC(═O)NRR' (wherein R and R' are independently hydrogen or a $C_{1-20}$ linear or branched alkyl group), —S(═O)R' (wherein R' is hydrogen or a $C_{1-20}$ linear or branched alkyl group), and —$S(═O)_2R'$ (wherein R' is hydrogen or a $C_{1-20}$ linear or branched alkyl group), provided that each $R^5$ is not hydrogen, any two adjacent groups selected from $R^2$ to $R^5$ are optionally connected to form a ring;

n1 is 0, 1, 2, or 3;

** indicates a point of attachment directly or indirectly to the polymer backbone; and

* indicates a point of attachment to the fullerene group.

8. The coated substrate of claim 1, wherein the linking group comprises a substituted or unsubstituted $C_{3-20}$ alicyclic group or a substituted or unsubstituted $C_{2-20}$ heteroalicyclic group, and wherein the $C_{3-20}$ alicyclic group or the $C_{2-20}$ heteroalicyclic group is attached to the polymer backbone through a single bond or a group selected from a $C_{1-10}$ alkylene group, an ether group, a carbonyl group, an ester group, a carbonate group, an amine group, an amide group, a urea group, a sulfate group, a sulfone group, a sulfoxide group, an N-oxide group, a sulfonate group, a sulfonamide group, or a combination of at least two of the foregoing.

9. The coated substrate of claim 1, wherein the polymer is a Novolac polymer, a vinyl aromatic polymer, or a copolymer thereof.

10. The coated substrate of claim 1, wherein the polymer backbone comprises carbon atoms only.

11. A polymer for a resist underlayer composition, comprising a polymer backbone, a substituted or unsubstituted $C_{50}$ to $C_{120}$ fullerene group pendent to the polymer backbone, and a linking group bonded to the polymer backbone and the fullerene group, wherein the linking group comprises a ring structure that utilizes two or more atoms on the fullerene group, wherein the polymer is self-crosslinkable, wherein the self-crosslinkable polymer refers to a polymer capable of undergoing a crosslinking reaction between units thereof without an aid of an additive catalyst or a crosslinking agent, and wherein the polymer is a polyalkylene, a polyalkylene oxide, a polypyrene, a Novolac polymer, a vinyl aromatic polymer, a (meth)acrylate polymer, a polyester, a norbornene polymer, a polyimide, a polymer comprising a group represented by Formula 3, a combination thereof, or a copolymer thereof:

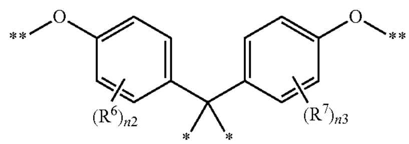

wherein, $R^6$ and $R^7$ are each independently deuterium, a substituted or unsubstituted $C_{1-20}$ linear or branched alkyl group, a substituted or unsubstituted $C_{6-20}$ aryl group, a substituted or unsubstituted $C_{7-20}$ arylalkyl group, a substituted or unsubstituted $C_{3-20}$ heteroaryl group, a substituted or unsubstituted $C_{3-30}$ heteroarylalkyl group, a substituted or unsubstituted $C_{3-30}$ cycloalkyl group, a substituted or unsubstituted $C_{3-30}$ heterocycloalkyl group, a $C_{1-20}$ alkoxy group, a hydroxy group, —NRR' (wherein R and R' are each independently hydrogen or a $C_{1-20}$ linear or branched alkyl group), an isocyanate group, a halogen, —ROR' (wherein R is a substituted or unsubstituted $C_{1-20}$ alkylene group and R' is hydrogen or a $C_{1-20}$ linear or branched alkyl group), —RC(═O)X (wherein R is a substituted or unsubstituted alkylene group and X is a halogen), —C(═O)OR' (wherein R' is hydrogen or a $C_{1-20}$ linear or branched alkyl group), —CN, —OC(═O)R' (wherein R' is hydrogen or a $C_{1-20}$ linear or branched alkyl group), —OC(═O)NRR' (wherein R and R' are each independently hydrogen or a $C_{1-20}$ linear or branched alkyl group), —S(═O)R' (wherein R' is hydrogen or a $C_{1-20}$ linear or branched alkyl group), or —S(═O)$_2$R' (wherein R' is hydrogen or a $C_{1-20}$ linear or branched alkyl group), any two adjacent groups selected from $R^6$ are optionally connected to form a ring, any two adjacent groups selected from $R^7$ are optionally connected to form a ring, n2 and n3 are each independently 0, 1, 2, 3, or 4,

* indicates a point of direct or indirect attachment to the fullerene group, and

** indicates a point of attachment to a polymer backbone.

12. The polymer of claim 11, wherein the polymer backbone comprises carbon atoms only.

13. The polymer of claim 11, wherein the linking group is represented by Formula 1 or Formula 2:

Formula 1

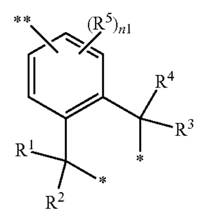

wherein, in Formula 1, $R^1$ to $R^5$ are each independently hydrogen, deuterium, a substituted or unsubstituted $C_{1-20}$ linear or branched alkyl group, a substituted or unsubstituted $C_{6-20}$ aryl group, a substituted or unsubstituted $C_{7-20}$ arylalkyl group, a substituted or unsubstituted $C_{3-20}$ heteroaryl group, a substituted or unsubstituted $C_{3-30}$ heteroarylalkyl group, a substituted or unsubstituted $C_{3-30}$ cycloalkyl group, a substituted or unsubstituted $C_{3-30}$ heterocycloalkyl group, a $C_{1-20}$ alkoxy group, a hydroxy group, —$NH_2$; —NRR' (wherein R and R' are independently hydrogen or a $C_{1-20}$ linear or branched alkyl group, an isocyanate group, a halogen, —ROR' (wherein R is a substituted or unsubstituted $C_{1-20}$ alkylene group and R' is hydrogen or a $C_{1-20}$ linear or branched alkyl group, —RC(═O)X (wherein R is a substituted or unsubstituted alkylene group and X is a halogen), —C(═O)OR' (wherein R' is hydrogen or a $C_{1-20}$ linear or branched alkyl group), —OC(═O)R' (wherein R' is hydrogen or a $C_{1-20}$ linear or branched alkyl group), —CN, —OC(═O)NRR' (wherein R and R' are independently hydrogen or a $C_{1-20}$ linear or branched alkyl group), —S(═O)R' (wherein R' is hydrogen or a $C_{1-20}$ linear or branched alkyl group), and —S(═O)$_2$R' (wherein R' is hydrogen or a $C_{1-20}$ linear or branched alkyl group), provided that each $R^5$ is not hydrogen, any two adjacent groups selected from $R^2$ to $R^5$ are optionally connected to form a ring;

n1 is 0, 1, 2, or 3;

** indicates a point of attachment directly or indirectly to the polymer backbone; and

* indicates a point of attachment to the fullerene group;

Formula 2

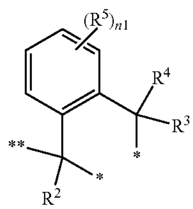

wherein, in Formula 2, $R^2$ to $R^5$ are each independently hydrogen, deuterium, a substituted or unsubstituted $C_{1-20}$ linear or branched alkyl group, a substituted or unsubstituted $C_{6-20}$ aryl group, a substituted or unsubstituted $C_{7-20}$ arylalkyl group, a substituted or unsubstituted $C_{3-20}$ heteroaryl group, a substituted or unsubstituted $C_{3-30}$ heteroarylalkyl group, a substituted or unsubstituted $C_{3-30}$ cycloalkyl group, a substituted or unsubstituted $C_{3-30}$ heterocycloalkyl group, a $C_{1-20}$ alkoxy group, a hydroxy group, —$NH_2$; —NRR' (wherein R and R' are independently hydrogen or a $C_{1-20}$ linear or branched alkyl group, an isocyanate group, a halogen, —ROR' (wherein R is a substituted or unsubstituted $C_{1-20}$ alkylene group and R' is hydrogen or a $C_{1-20}$ linear or branched alkyl group, —RC(═O)X (wherein R is a substituted or unsubstituted alkylene group and X is a halogen), —C(═O)OR' (wherein R' is hydrogen or a $C_{1-20}$ linear or branched alkyl group), —OC(═O)R' (wherein R' is hydrogen or a $C_{1-20}$ linear or branched alkyl group), —CN, —OC(═O)NRR' (wherein R and R' are independently hydrogen or a $C_{1-20}$ linear or branched alkyl group), —S(═O)R' (wherein R' is hydrogen or a $C_{1-20}$ linear or branched alkyl group), and —S(═O)$_2$R' (wherein R' is hydrogen or a $C_{1-20}$ linear or branched alkyl group), provided that each $R^5$ is not hydrogen, any two adjacent groups selected from $R^2$ to $R^5$ are optionally connected to form a ring;

n1 is 0, 1, 2, or 3;

** indicates a point of attachment directly or indirectly to the polymer backbone; and

* indicates a point of attachment to the fullerene group.

14. A method of forming a pattern, the method comprising: (a) applying a layer of the resist underlayer composition over a substrate; (b) curing the applied resist underlayer composition to form a resist underlayer; and (c) forming a photoresist layer over the resist underlayer, wherein the resist underlayer composition comprises:

a polymer comprising a polymer backbone and a substituted or unsubstituted $C_{50}$ to $C_{120}$ fullerene group pendant to the polymer backbone, and a solvent in an amount of from 50 to 99.9 weight % based on the total resist underlayer composition, wherein the resist underlayer composition is free of additive crosslinking compounds, wherein the polymer further comprises a linking group bonded to the fullerene group and to the polymer backbone, wherein the linking group comprises a ring structure that utilizes two or more atoms on the fullerene group, and wherein the polymer is a polyalkylene, a polyalkylene oxide, a polyarylene, a Novolac polymer, a vinyl aromatic polymer, a (meth)acrylate polymer, a polyester, a norbornene polymer, a polyimide, a combination thereof, or a copolymer thereof.

15. The method of claim 14, further comprising forming a silicon-containing layer and/or an organic antireflective coating layer above the resist underlayer prior to forming the photoresist layer.

16. The method of claim 14, further comprising patterning the photoresist layer and transferring the pattern from the patterned photoresist layer to the resist underlayer and to a layer below the resist underlayer.

* * * * *